United States Patent
Mizunashi

(10) Patent No.: US 12,139,634 B2
(45) Date of Patent: Nov. 12, 2024

(54) SILYLATED ISOCYANURATE COMPOUND, METAL CORROSION INHIBITOR, CURABLE ORGANOSILICON RESIN COMPOSITION, AND SEMICONDUCTOR APPARATUS

(71) Applicant: SHIN-ETSU CHEMICAL CO., LTD., Tokyo (JP)

(72) Inventor: Tomoyuki Mizunashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 729 days.

(21) Appl. No.: 17/216,020

(22) Filed: Mar. 29, 2021

(65) Prior Publication Data
US 2022/0064382 A1 Mar. 3, 2022

(30) Foreign Application Priority Data

Apr. 14, 2020 (JP) ................................. 2020-072496
Apr. 14, 2020 (JP) ................................. 2020-072522

(51) Int. Cl.
| | |
|---|---|
| C09D 183/04 | (2006.01) |
| C07F 7/08 | (2006.01) |
| C07F 7/18 | (2006.01) |
| C08G 77/12 | (2006.01) |
| C08G 77/20 | (2006.01) |
| C08G 77/26 | (2006.01) |
| C23F 11/00 | (2006.01) |
| C23F 11/14 | (2006.01) |
| H01L 23/29 | (2006.01) |
| H01L 33/56 | (2010.01) |
| C08G 77/00 | (2006.01) |

(52) U.S. Cl.
CPC .......... *C09D 183/04* (2013.01); *C07F 7/0812* (2013.01); *C07F 7/1804* (2013.01); *C07F 7/188* (2013.01); *C08G 77/12* (2013.01); *C08G 77/20* (2013.01); *C08G 77/26* (2013.01); *C23F 11/00* (2013.01); *C23F 11/149* (2013.01); *H01L 23/296* (2013.01); *H01L 33/56* (2013.01); *C08G 77/80* (2013.01)

(58) Field of Classification Search
CPC .... C23F 11/149; C09D 183/04; C07F 7/0812; C07F 7/1804; C08K 5/34924; C07D 251/34; H01L 33/56; H01L 23/296
See application file for complete search history.

(56) References Cited

U.S. PATENT DOCUMENTS

| | | | |
|---|---|---|---|
| 2010/0059177 A1* | 3/2010 | Kashiwagi | ............. C08L 83/04 525/477 |
| 2014/0187733 A1 | 7/2014 | Okawa et al. | |
| 2015/0252221 A1 | 9/2015 | Iimura et al. | |

FOREIGN PATENT DOCUMENTS

| | | | | |
|---|---|---|---|---|
| JP | 2012-056251 A | 3/2012 | | |
| JP | 2014-088513 A | 5/2014 | | |
| JP | 2017-115116 A | 6/2017 | | |
| JP | 2020-019857 A * | 2/2020 | ............. | C08G 77/08 |
| WO | 2013/005859 A1 | 1/2013 | | |
| WO | WO-2013115416 A1 * | 8/2013 | .......... | C08G 77/045 |
| WO | WO 2018/235811 A1 * | 12/2018 | | |

OTHER PUBLICATIONS

Machine translation of JP 2017-115116 (no date).*
Machine translation of JP 2020-019857 (no date).*
Jan. 24, 2023 Office Action issued in Japanese Patent Application No. 2020-072496.

* cited by examiner

*Primary Examiner* — Marc S Zimmer
(74) *Attorney, Agent, or Firm* — Oliff PLC

(57) ABSTRACT

The present invention provides a silylated isocyanurate compound shown by the following general formula (1), where R's each independently represent a hydrogen atom, or a substituent selected from the group consisting of an alkyl group having 1 to 10 carbon atoms, an alkenyl group having 2 to 10 carbon atoms, and a group shown by a general formula (2-a) or (2-b). At least one R is shown by the general formula (2-b). The silylated isocyanurate compound can serve as a metal corrosion inhibitor excellent in heat resistance and sulfurization resistance.

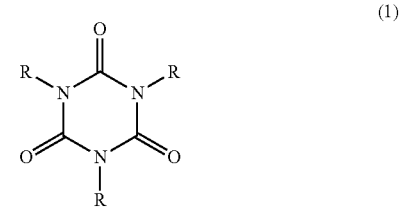

(1)

11 Claims, 1 Drawing Sheet

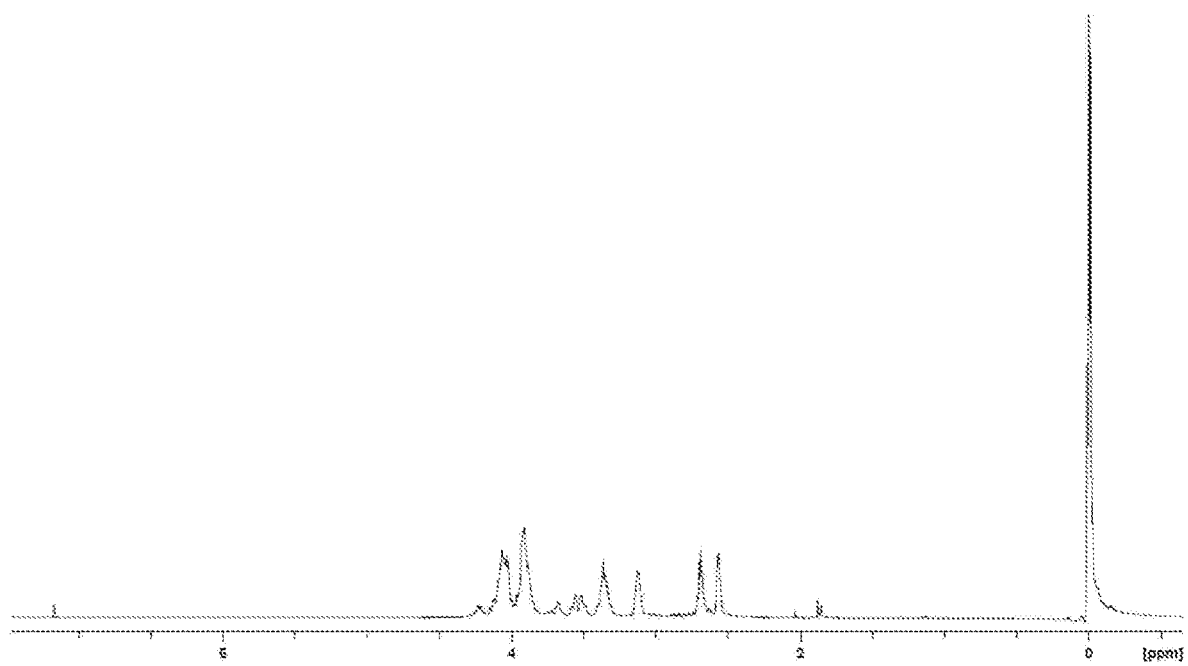

SILYLATED ISOCYANURATE COMPOUND, METAL CORROSION INHIBITOR, CURABLE ORGANOSILICON RESIN COMPOSITION, AND SEMICONDUCTOR APPARATUS

TECHNICAL FIELD

The present invention relates to a silylated isocyanurate compound useful as a metal corrosion inhibitor, a curable organosilicon resin composition, and a semiconductor apparatus.

BACKGROUND ART

Recently, optical semiconductor devices have been used as LED illumination in outdoor illumination, vehicle illumination, or the like. As an encapsulant for such an optical semiconductor device, generally, resins with high gas or water permeability, such as silicone resins, are used. Hence, in severe environments such as outdoors, a silver-plated layer used as an electrode or reflection layer of an optical semiconductor device is corroded by sulfur-based gas or water, resulting in a problem that the luminance is considerably lowered.

As a measure against this, an introduction of an aromatic substituent such as a phenyl group has been studied to increase the refractive index and gas barrier property (Patent Documents 1 and 2). However, the introduction of an aromatic substituent brings about a problem of lowered heat resistance.

Meanwhile, as corrosion inhibitors for preventing metal corrosion, for example, N-containing aromatic hydrocarbon compounds such as benzotriazole and 5-methylbenzimidazole or metal complexes of zinc and so forth have been known. Adding such corrosion inhibitors has also been tested. However, there is a problem that discoloration of the corrosion inhibitors and metal ligands considerably lowers the heat resistance of the resulting resin (Patent Document 3).

CITATION LIST

Patent Literature

Patent Document 1: JP 2014-088513 A
Patent Document 2: WO 2013/005859 A1
Patent Document 3: JP 2012-056251 A

SUMMARY OF INVENTION

Technical Problem

The present invention has been made in view of the above-described problems. An object of the present invention is to provide a silylated isocyanurate compound that can serve as a metal corrosion inhibitor excellent in heat resistance and sulfurization resistance. Further, another object of the present invention is to provide a curable organosilicon resin composition containing the silylated isocyanurate compound excellent in heat resistance and sulfurization resistance, and a semiconductor apparatus.

Solution to Problem

The present inventor has earnestly studied to achieve the object and consequently found that a silicone-modified isocyanurate compound shown by the following general formula (1) can achieve the object. This finding has led to the completion of the present invention.

Specifically, the present invention provides a silylated isocyanurate compound shown by the following general formula (1):

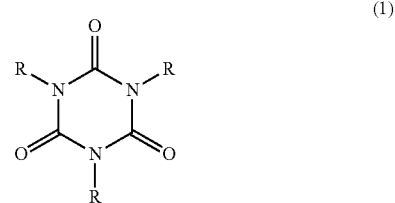

wherein R's each independently represent a hydrogen atom, or a substituent selected from the group consisting of an alkyl group having 1 to 10 carbon atoms, an alkenyl group having 2 to 10 carbon atoms, and a group shown by the following general formula (2-a) or (2-b), given that at least one of the R's is shown by the following general formula (2-b),

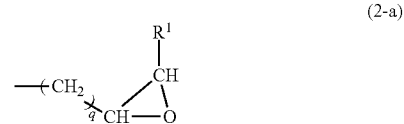

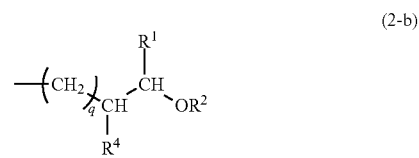

wherein $R^1$ represents a hydrogen atom or an alkyl group having 1 to 8 carbon atoms; "q" represents an integer of 1 to 10; $R^2$'s each independently represent a hydrogen atom, or a substituent selected from the group consisting of an alkyl group having 1 to 10 carbon atoms and a group shown by the following general formula (3), given that at least one of the $R^2$'s is shown by the following general formula (3); and $R^4$ represents a hydrogen atom or $OR^2$,

wherein $R^3$'s each independently represent a hydrogen atom, or a substituent selected from the group consisting of an alkyl group having 1 to 10 carbon atoms, an alkoxy group having 1 to 10 carbon atoms, an alkenyl group having 2 to 10 carbon atoms, and an aryl group having 6 to 10 carbon atoms.

Such a silylated isocyanurate compound is a compound excellent in heat resistance and sulfurization resistance.

Moreover, the present invention provides a metal corrosion inhibitor comprising the silylated isocyanurate compound shown by the general formula (1).

An addition reaction-curable silicone composition containing the inventive silylated isocyanurate compound as an additive is capable of forming a cured product excellent in heat resistance and sulfurization resistance, and is useful as a metal corrosion inhibitor and so forth.

Further, the present invention provides a curable organosilicon resin composition comprising:

(A) an organosilicon compound having at least two alkenyl groups per molecule;
(B) an organosilicon compound having at least two hydrogen atoms bonded to silicon atoms per molecule, wherein an amount of SiH groups in the component (B) is 0.1 to 4.0 mol relative to 1 mol of alkenyl groups in the component (A);
(C) a platinum group metal-based catalyst; and
(D) a silylated isocyanurate compound as a metal corrosion inhibitor shown by the following general formula (1),

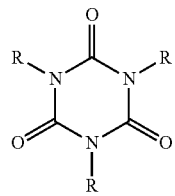

(1)

wherein R's each independently represent a hydrogen atom, or a substituent selected from the group consisting of an alkyl group having 1 to 10 carbon atoms, an alkenyl group having 2 to 10 carbon atoms, and a group shown by the following general formula (2-a) or (2-b), given that at least one of the R's is shown by the following general formula (2-b),

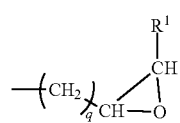

(2-a)

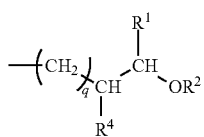

(2-b)

wherein $R^1$ represents a hydrogen atom or an alkyl group having 1 to 8 carbon atoms; "q" represents an integer of 1 to 10; $R^2$'s each independently represent a hydrogen atom, or a substituent selected from the group consisting of an alkyl group having 1 to 10 carbon atoms and a group shown by the following general formula (3), given that at least one of the $R^2$'s is shown by the following general formula (3); and $R^4$ represents a hydrogen atom or $OR^2$,

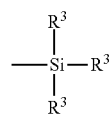

(3)

wherein $R^3$'s each independently represent a hydrogen atom, or a substituent selected from the group consisting of an alkyl group having 1 to 10 carbon atoms, an alkoxy group having 1 to 10 carbon atoms, an alkenyl group having 2 to 10 carbon atoms, and an aryl group having 6 to 10 carbon atoms.

Such an addition reaction-curable silicone composition containing the silylated isocyanurate compound as an additive can form a cured product excellent in heat resistance and sulfurization resistance.

In this case, the component (A) preferably comprises
(A1) a resinous organopolysiloxane comprising
at least two silicon atom-bonded alkenyl groups per molecule, and
at least any of an $SiO_{4/2}$ unit and an $R^4SiO_{3/2}$ unit, wherein $R^4$ represents an alkyl group having 1 to 10 carbon atoms, an alkenyl group having 2 to 10 carbon atoms, or an aryl group having 6 to 10 carbon atoms.

Moreover, in this case, the component (A1) is preferably a resinous organopolysiloxane comprising
0 to 60 mol % of the $SiO_{4/2}$ unit,
0 to 90 mol % of the $R^4SiO_{3/2}$ unit,
0 to 50 mol % of an $(R^4)_2SiO_{2/2}$ unit, and
10 to 50 mol % of an $(R^4)_3SiO_{1/2}$ unit, given that a sum of the $SiO_{4/2}$ unit and the $R^4SiO_{3/2}$ unit is 50 mol % or more,
the organopolysiloxane has a weight-average molecular weight of 1,000 to 5,000,
the organopolysiloxane has at least two silicon atom-bonded alkenyl groups per molecule,
the organopolysiloxane has a hydroxyl group and an alkoxy group each of which is bonded to a silicon atom and is an uncondensed remainder derived from the $SiO_{4/2}$ unit, the $R^4SiO_{3/2}$ unit, the $(R^4)_2SiO_{2/2}$ unit, and the $(R^4)_3SiO_{1/2}$ unit,
the hydroxyl group is in an amount of 0.001 to 1.0 mol/100 g, and
the alkoxy group bonded to a silicon atom has 1 to 10 carbon atoms and is in an amount of not more than 1.0 mol/100 g.

The composition as described above has little risks of becoming brittle and losing fluidity, either. Additionally, when the amount of the hydroxyl group bonded to a silicon atom is not less than 0.001 mol/100 g, sufficient adhesiveness can be ensured. When the amount is not more than 1.0 mol/100 g, the storage stability will not be lowered, and the surface has little tackiness. Furthermore, when the amount of the alkoxy group is not more than 1.0 mol/100 g, by-product alcohol gas is hardly generated in curing, and there is no risk of leaving voids in the cured product.

In this case, the component (A) preferably further comprises, in addition to the component (A1),
(A2) a linear or branched organopolysiloxane having two or more silicon atom-bonded alkenyl groups, each having 2 to 10 carbon atoms, per molecule, wherein the linear or branched organopolysiloxane has a viscosity at 25° C. of 10 to 100,000 mPa·s as measured by a method described in JIS K 7117-1:1999.

This enables viscosity and hardness adjustments depending on the usage. Additionally, when the viscosity is 10 mPa·s or more, the composition has a lower risk of becoming brittle. When the viscosity is 100,000 mPa·s or less, there is a lower risk of having poor workability.

In this case, the components (A1) and (A2) are preferably blended in such amounts that the component (A1) is 5 to 100 mass %, given that a total amount of the components (A1) and (A2) is 100 mass %.

Thereby, various properties are improved, and the handleability is excellent.

The curable organosilicon resin composition preferably further comprises a component (E) that is a cyclic siloxane shown by the following general formula (4), wherein
the cyclic siloxane shown by the general formula (4) is in an amount of 0.1 to 30 mass % relative to a total mass of the components (A) and (B), and
a total amount of hydrosilyl groups in the curable organosilicon resin composition is 0.1 to 4.0 mol per mol of a total amount of alkenyl groups in the curable organosilicon resin composition,

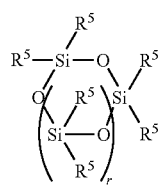

(4)

wherein each $R^5$ independently represents a hydrogen atom, an alkenyl group having 2 to 10 carbon atoms, an alkyl group having 1 to 10 carbon atoms, or an aryl group having 6 to 10 carbon atoms; and "r" represents an integer of 1 or 2.

Adding the component (E) as described above can provide effects of adjusting viscosity, curability, and curing properties.

Herein, the inventive composition preferably comprises at least one inorganic white pigment selected from the group consisting of titanium oxide, zinc oxide, zirconium oxide, calcium carbonate, magnesium oxide, aluminum hydroxide, barium carbonate, magnesium silicate, zinc sulfate, and barium sulfate.

These compounds are suitably usable because the inventive curable organosilicon resin composition is excellent in weather resistance and transparency.

Furthermore, the present invention provides a semiconductor apparatus comprising:
a cured product of the curable organosilicon resin composition; and
a semiconductor device.

The inventive curable organosilicon resin composition results in a cured product excellent in sulfurization resistance, mechanical properties, transparency, crack resistance, and heat resistance. Accordingly, the inventive curable organosilicon resin composition is suitable for a lens material, a protective coating agent, a molding agent, and so forth for light-emitting semiconductor devices, and is particularly useful for encapsulating LED devices such as blue LED, white LED, and ultraviolet LED. Moreover, because of the excellent heat resistance, even when the inventive curable organosilicon resin composition blended with a silicate-based fluorescent substance or a quantum dot fluorescent substance is used as a material for a wavelength conversion film, it is possible to provide a light-emitting semiconductor device which can ensure long-time reliability under high humidity, and which has favorable moisture resistance and long-time color rendering property.

In this case, the cured product with a thickness of 1 mm preferably has a direct light transmittance of 70% or more at a wavelength of 450 nm.

When the cured product has such a direct light transmittance, the transparency is excellent. Thus, the present invention is particularly suitably applicable in optical uses such as an encapsulant for LED.

Here, the semiconductor device is preferably a light-emitting device.

The present invention is suitably applicable to a light-emitting device.

Advantageous Effects of Invention

As described above, the inventive silylated isocyanurate compound is a compound having excellent heat resistance and sulfurization resistance.

Accordingly, an addition reaction-curable silicone composition containing the inventive silylated isocyanurate compound as an additive can form a cured product excellent in heat resistance and sulfurization resistance. Thus, the inventive silylated isocyanurate compound is useful as a metal corrosion inhibitor and so on. Moreover, according to the inventive curable organosilicon resin composition, the addition reaction-curable silicone composition (curable organosilicon resin composition) containing the silylated isocyanurate compound as an additive can form a cured product that is excellent in mechanical properties, transparency, crack resistance, heat resistance, and sulfurization resistance. Further, a cured product of the inventive curable organosilicon resin composition is suitable for a lens material, a protective coating agent, a molding agent, and so forth for light-emitting semiconductor devices. Furthermore, semiconductor apparatus including the cured product and a semiconductor device can provide a light-emitting semiconductor device which can ensure long-time reliability under high humidity and has favorable moisture resistance and long-time color rendering property.

BRIEF DESCRIPTION OF DRAWINGS

FIG. 1 is a 1H-NMR spectrum chart of a compound (mixture) synthesized in Example 1 ([Synthesis Example]).

DESCRIPTION OF EMBODIMENTS

Hereinafter, the present invention will be described in detail. However, the present invention is not limited thereto.

The present invention provides a silylated isocyanurate compound shown by the following general formula (1). Incidentally, the silylated isocyanurate compound may also be referred to as silicone-modified isocyanurate compound or silylation-modified isocyanurate compound.

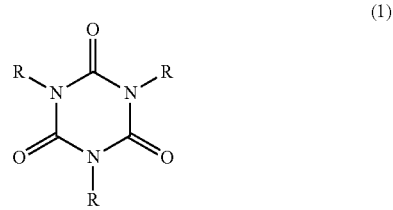

(1)

In the general formula (1), R's each independently represent a hydrogen atom, or a substituent selected from the group consisting of an alkyl group having 1 to 10 carbon atoms, an alkenyl group having 2 to 10 carbon atoms, and a group shown by the following general formula (2-a) or (2-b), given that at least one of the R's is shown by the following general formula (2-b).

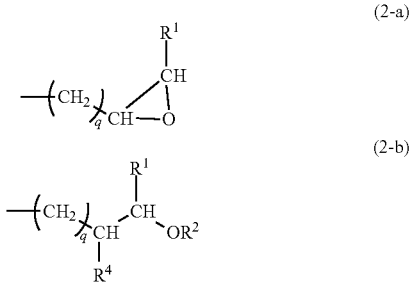

In the general formulae (2-a) and (2-b), $R^1$ represents a hydrogen atom or an alkyl group having 1 to 8 carbon atoms. Moreover, "q" represents an integer of 1 to 10. Further, $R^2$'s each independently represent a hydrogen atom, or a substituent selected from the group consisting of an alkyl group having 1 to 10 carbon atoms and a group shown by the following general formula (3), given that at least one of the $R^2$'s is shown by the following general formula (3). $R^4$ represents a hydrogen atom or $OR^2$.

In the general formula (3), $R^3$'s each independently represent a hydrogen atom, or a substituent selected from the group consisting of an alkyl group having 1 to 10 carbon atoms, an alkoxy group having 1 to 10 carbon atoms, an alkenyl group having 2 to 10 carbon atoms, and an aryl group having 6 to 10 carbon atoms.

Here, as R's, examples of the alkyl group having 1 to 10 carbon atoms include a methyl group, an ethyl group, an n-propyl group, an isopropyl group, an n-butyl group, an isobutyl group, a s-butyl group, a t-butyl group, a pentyl group, a hexyl group, a heptyl group, an octyl group, etc. Additionally, examples of the alkenyl group having 2 to 10 carbon atoms include a vinyl group, an allyl group, a 3-butenyl group, a hexenyl group, a cyclohexenyl group, an octenyl group, etc.

The R's in the general formula (1) are characterized in that at least one R is shown by the general formula (2-b), while the other R (s) may represent a hydrogen atom, a methyl group, an allyl group, the general formula (2-a), or the general formula (2-b). More preferably, the other R (s) represent the general formula (2-a) or the general formula (2-b).

In the general formulae (2-a) and (2-b), each $R^1$ is a hydrogen atom or an alkyl group having 1 to 8 carbon atoms. Specific examples thereof include lower alkyl groups, such as, a methyl group, an ethyl group, a propyl group, and a butyl group; cycloalkyl groups, such as a cyclohexyl group; etc. Among these, a hydrogen atom or a methyl group is preferable.

Moreover, in the general formulae (2-a) and (2-b), each $R^2$ is independently a hydrogen atom, or a group selected from any of an alkyl group having 1 to 10 carbon atoms and a group shown by the general formula (3). As $R^2$'s, examples of the alkyl group having 1 to 10 carbon atoms include those exemplified above as R. $R^2$'s are characterized in that at least one $R^2$ in the general formula (2-b) is a group shown by the formula (3), and the other $R^2$ is preferably a hydrogen atom, a methyl group, or a group shown by the formula (3).

In the general formula (3), each $R^3$ independently represents a hydrogen atom, or a substituent selected from the group consisting of an alkyl group having 1 to 10 carbon atoms, an alkoxy group having 1 to 10 carbon atoms, an alkenyl group having 2 to 10 carbon atoms, and an aryl group having 6 to 10 carbon atoms.

Here, examples of the alkyl group having 1 to 10 carbon atoms include those exemplified above as R. Moreover, examples of the alkoxy group having 1 to 10 carbon atoms include a methoxy group, an ethoxy group, an n-propoxy group, an isopropoxy group, an n-butoxy group, an isobutoxy group, a s-butoxy group, a t-butoxy group, a pentoxy group, a hexoxy group, a heptoxy group, an octoxy group, etc. Further, examples of the alkenyl group having 2 to 10 carbon atoms include a vinyl group, an allyl group, a propenyl group, an isopropenyl group, a butenyl group, a hexenyl group, a cyclohexenyl group, an octenyl group, etc. Furthermore, examples of the aryl group having 6 to 10 carbon atoms include aryl groups, such as a phenyl group, a tolyl group, and a xylyl group; aralkyl groups, such as a benzyl group, a phenylethyl group, and a phenylpropyl group; etc. Among these, a methyl group, a phenyl group, or a vinyl group is preferable.

In the general formulae (2-a) and (2-b), each "q" is an integer of 1 to 10, preferably an integer of 1 to 8, more preferably an integer of 1 to 5.

Examples of the silylation-modified isocyanurate compound shown by the general formula (1) include compounds shown by the following formulae.

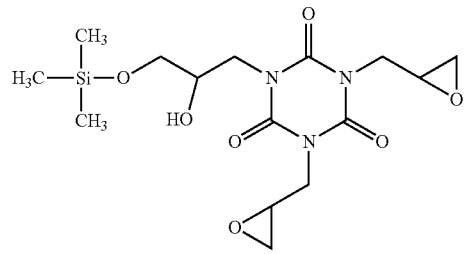

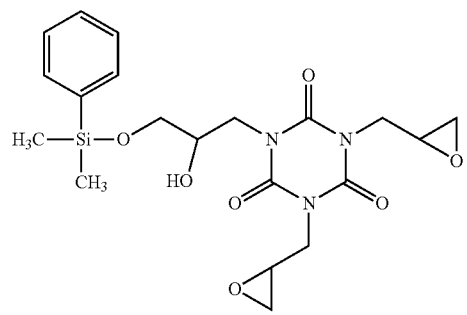

9
-continued
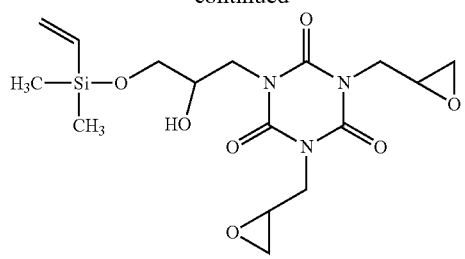
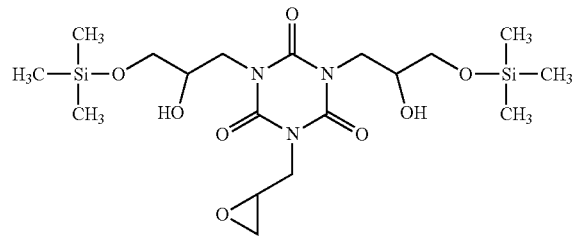
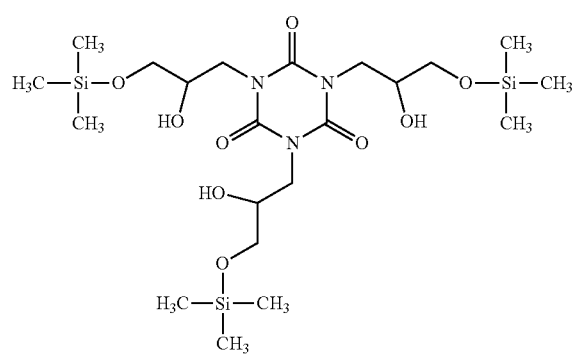
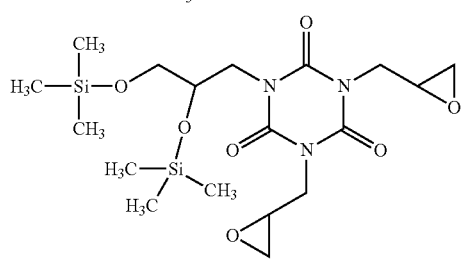
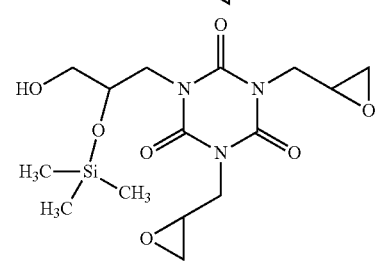
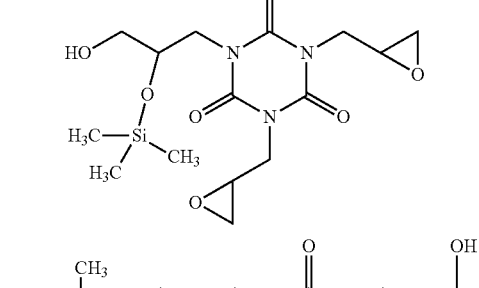
10
-continued
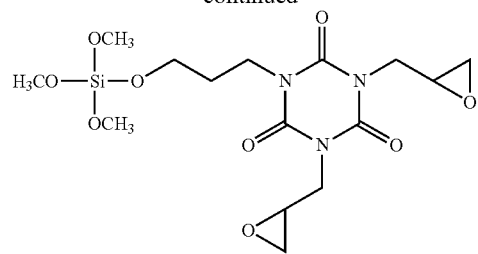
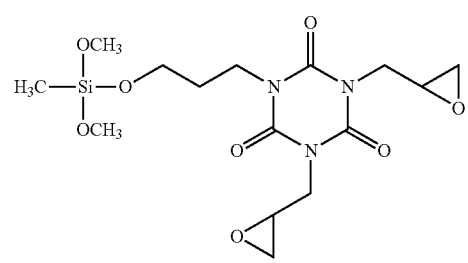
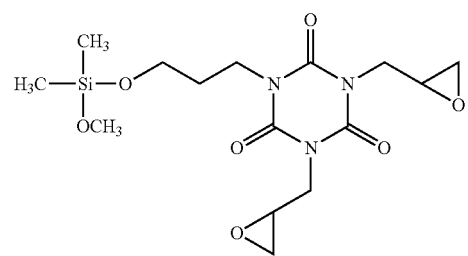
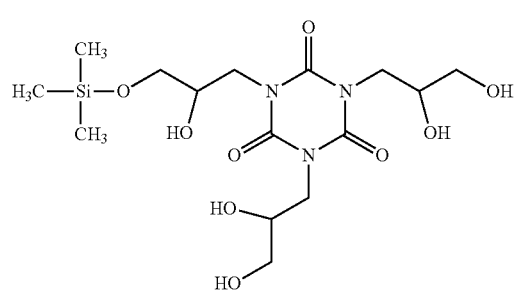
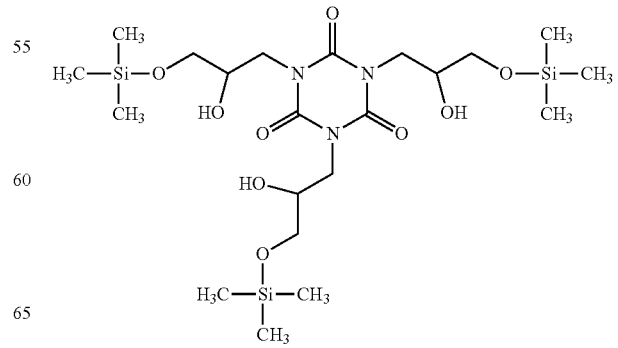

-continued

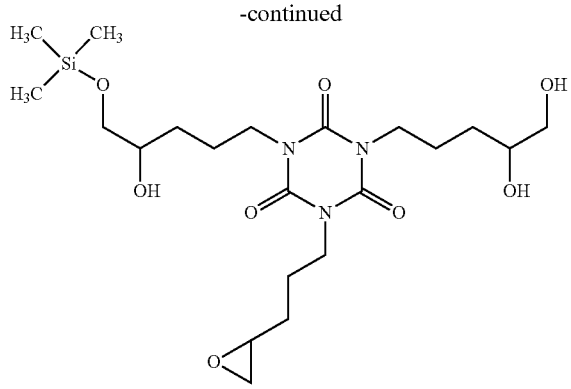

[Production Method for Silylation-Modified Isocyanurate Compound]

The inventive silylation-modified isocyanurate compound can be produced, for example, by hydrolysis reaction of triglycidyl isocyanurate with chlorosilane and alkoxysilane. The conditions for the hydrolysis reaction can be adjusted as appropriate. For example, the reaction ratio between the epoxy groups and trimethylchlorosilane in terms of mol is 1:1.

[Corrosion Inhibitor]

The inventive silylated isocyanurate compound is capable of exhibiting excellent effects as a metal corrosion inhibitor. Thus, a metal corrosion inhibitor containing the inventive silylated isocyanurate compound is preferable.

When used as a corrosion inhibitor, the inventive silylated isocyanurate compound may be added in an amount of 0.001 to 5 mass %, preferably 0.01 to 3 mass %, relative to a resin composition. The composition of the resin composition is not particularly limited, and examples thereof include acrylic resin, epoxy resin, isocyanate resin, urethane resin, olefin resin, silicone resin, etc. Among these, silicone resin, epoxy resin, urethane resin, or acrylic resin is preferable, and silicone resin is particularly preferable.

Additionally, the excellent effects as a metal corrosion inhibitor can be exhibited also when the inventive silylated isocyanurate compound is dissolved in an organic solvent and applied to a substrate. The organic solvent is not particularly limited. Examples thereof include aromatic hydrocarbon-based solvents, such as benzene, toluene, and xylene; ether-based solvents, such as tetrahydrofuran, 1,4-dioxane, diethyl ether, diglyme, triglyme, and diethyl carbitol; ketone-based solvents, such as methyl ethyl ketone, methyl isobutyl ketone, and cyclohexanone; halogenated hydrocarbon-based solvents, such as chloroform, methylene chloride, and 1,2-dichloroethane; alcohol-based solvents, such as methanol, ethanol, isopropyl alcohol, isobutyl alcohol, and cyclohexanol; carbitol-based solvents, such as carbitol, methyl carbitol, and butyl carbitol; organosiloxane-based solvents, such as octamethylcyclotetrasiloxane and hexamethyldisiloxane; etc. Other examples of the solvent include cellosolve-based solvents, such as cellosolve acetate and butyl cellosolve; etc. One of these organic solvents may be used alone, or two or more thereof may be used in combination.

The present inventor has earnestly studied to achieve the above-described object and consequently found that a curable organopolysiloxane resin composition which exhibits high reaction-inhibitory effect, and which is stable under high-temperature high-humidity condition, is obtained by using a curable organosilicon resin composition containing:

(A) an organosilicon compound having at least two alkenyl groups per molecule;

(B) an organosilicon compound having at least two hydrogen atoms bonded to silicon atoms per molecule, and contained such that an amount of SiH groups in the component (B) is 0.1 to 4.0 mol relative to 1 mol of alkenyl groups in the component (A);

(C) a platinum group metal-based catalyst; and (D) a silylated isocyanurate compound as a metal corrosion inhibitor shown by the following general formula (1),

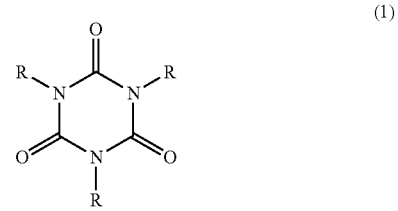

where R's each independently represent a hydrogen atom, or a substituent selected from the group consisting of an alkyl group having 1 to 10 carbon atoms, an alkenyl group having 2 to 10 carbon atoms, and a group shown by the following general formula (2-a) or (2-b), given that at least one of the R's is shown by the following general formula (2-b),

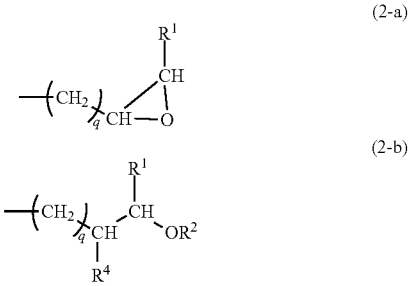

where $R^1$ represents a hydrogen atom or an alkyl group having 1 to 8 carbon atoms; "q" represents an integer of 1 to 10; $R^2$'s each independently represent a hydrogen atom, or a substituent selected from the group consisting of an alkyl group having 1 to 10 carbon atoms and a group shown by the following general formula (3), given that at least one of the $R^2$'s is shown by the following general formula (3); and $R^4$ represents a hydrogen atom or $OR^2$,

where $R^3$'s each independently represent a hydrogen atom, or a substituent selected from the group consisting of an alkyl group having 1 to 10 carbon atoms, an alkoxy group having 1 to 10 carbon atoms, an alkenyl group having 2 to 10 carbon atoms, and an aryl group having 6 to 10 carbon atoms.

This finding has led to the completion of the present invention.

[(A) Alkenyl Group-Containing Organosilicon Compound]

The component (A) in the present invention is an alkenyl group-containing organosilicon compound characterized by having at least two alkenyl groups, preferably 2 to 5 alkenyl groups, per molecule. The alkenyl groups are preferably capable of addition reaction with hydrosilyl groups.

The component (A) may be any of: a linear organopolysiloxane or branched organopolysiloxane, which is a component (A2) to be described later; and a resinous (having network-like structure) organopolysiloxane, which is a component (A1) to be described below. One of these may be used, or two or more kinds of each may be used in combination, but it is preferable to incorporate the resinous (network-structured) organopolysiloxane (A1). It is further preferable to incorporate both of the component (A1) and the component (A2). Hereinbelow, each component will be described in detail.

[(A1) Resinous (Network-Structured) Organopolysiloxane]

The component (A1) of the present invention is a resinous (network-structured) organopolysiloxane having at least two silicon atom-bonded alkenyl groups per molecule, and containing at least any of an $SiO_{4/2}$ unit and an $R^4SiO_{3/2}$ unit ($R^4$ represents an alkyl group having 1 to 10 carbon atoms, an alkenyl group having 2 to 10 carbon atoms, or an aryl group having 6 to 10 carbon atoms). The component (A1) has a weight-average molecular weight (Mw) of preferably 1,000 to 5,000, more preferably 1,100 to 3,000. When the molecular weight (Mw) is 1,000 or more, the composition has little risk of becoming brittle. When the molecular weight (Mw) is 5,000 or less, the composition avoids risks of having high viscosity and losing fluidity.

Examples of the alkyl group having 1 to 10 carbon atoms include a methyl group, an ethyl group, an n-propyl group, an isopropyl group, an n-butyl group, an isobutyl group, a s-butyl group, a t-butyl group, a pentyl group, a hexyl group, a heptyl group, an octyl group, etc. Moreover, examples of the alkenyl group having 2 to 10 carbon atoms include a vinyl group, an allyl group, a 3-butenyl group, a hexenyl group, a cyclohexenyl group, an octenyl group, etc.

Examples of the alkenyl group having 2 to 10, preferably 2 to 5, carbon atoms include a vinyl group, an allyl group, a propenyl group, an isopropenyl group, a butenyl group, a hexenyl group, a cyclohexenyl group, an octenyl group, etc. A vinyl group is preferable. The number of such alkenyl groups is preferably 2 to 5 so that the alkenyl groups are bonded to at least two silicon atoms per molecule.

Examples of the aryl group having 6 to 10, preferably 6 to 8, carbon atoms include aryl groups, such as a phenyl group, a tolyl group, and a xylyl group; aralkyl groups, such as a benzyl group, a phenylethyl group, and a phenylpropyl group; etc. A phenyl group is preferable. The number of such aryl groups is preferably at least one, more preferably 2 to 100, per molecule.

Note that, in the present invention, the weight-average molecular weight (Mw) refers to a weight-average molecular weight measured by gel permeation chromatography (GPC) under the following conditions using polystyrene as standard substance.

[Measurement Conditions]
Eluent: tetrahydrofuran (THF),
Flow rate: 0.6 mL/min,
Detector: differential refractive index detector (RI),
Columns: TSK Guardcolumn SuperH-L,
  TSKgel SuperH4000 (6.0 mm I.D.×15 cm×1),
  TSKgel SuperH3000 (6.0 mm I.D.×15 cm×1),
  TSKgel SuperH2000 (6.0 mm I.D.×15 cm×2), (all are manufactured by Tosoh Corporation)
Column temperature: 40° C.,
Sample injection amount: 20 μL (THF solution with a concentration of 0.5 mass %).

Further, the component (A1) contains alkenyl groups in an amount of normally 0.01 to 0.5 mol/100 g, preferably 0.05 to 0.3 mol/100 g, more preferably 0.10 to 0.25 mol/100 g.

When the amount of the silicon atom-bonded alkenyl group is not less than 0.01 mol/100 g, the composition has sufficient crosslinking points for curing. The amount is preferably not more than 0.5 mol/100 g because there is no risk of losing toughness due to excessively high crosslinking density.

Furthermore, the component (A1) has a hydroxyl group which is bonded to a silicon atom. Such hydroxyl group is contained normally in an amount of preferably 0.001 to 1.0 mol/100 g, more preferably 0.005 to 0.8 mol/100 g, further preferably 0.008 to 0.6 mol/100 g.

When the amount of the hydroxyl group bonded to a silicon atom is not less than 0.001 mol/100 g, sufficient adhesiveness can be ensured. The amount is preferably not more than 1.0 mol/100 g because the storage stability will not be lowered and the surface has little tackiness.

Furthermore, the component (A1) has an alkoxy group which is bonded to a silicon atom, and which has 1 to 10 carbon atoms, preferably 1 to 5 carbon atoms. Such alkoxy group is contained normally in an amount of preferably not more than 1.0 mol/100 g, more preferably not more than 0.8 mol/100 g, further preferably not more than 0.5 mol/100 g.

When the amount of the alkoxy group is not more than 1.0 mol/100 g, by-product alcohol gas is hardly generated during curing, eliminating a risk of leaving voids in the cured product.

Note that, in the present invention, the amounts of the hydroxyl group and the alkoxy group each of which is bonded to a silicon atom refer to values measured by $^1$H-NMR and $^{29}$Si-NMR.

Note that the hydroxyl group and the alkoxy group each of which is bonded to a silicon atom are uncondensed remainders derived from a material for obtaining a siloxane unit (Q unit, T unit, D unit, M unit) to be described later, in the production of the resinous organopolysiloxane as the component (A1).

Further, the component (A1) containing at least any of the $SiO_{4/2}$ unit and the $R^4SiO_{3/2}$ unit ($R^4$ is an alkyl group having 1 to 10 carbon atoms, an alkenyl group having 2 to 10 carbon atoms, or an aryl group having 6 to 10 carbon atoms) is preferably an organopolysiloxane having a resin structure containing: normally 0 to 60 mol %, preferably 0 to 50 mol %, of the $SiO_{4/2}$ unit (Q unit); normally 0 to 90 mol %, preferably 30 to 80 mol %, of the $R^4SiO_{3/2}$ unit (T unit); normally 0 to 50 mol %, preferably 0 to 20 mol %, of an $(R^4)_2SiO_{2/2}$ unit (D unit); and normally 0 to 50 mol %, preferably 10 to 30 mol %, of an $(R^4)_3SiO_{1/2}$ unit (M unit). A sum of the $SiO_{4/2}$ unit and the $R^4SiO_{3/2}$ unit is preferably 50 mol % or more, more preferably 60 to 90 mol %.

Each $R^4$ is independently any of: a substituted or unsubstituted monovalent alkyl group having 1 to 10 carbon atoms, preferably 2 to 5 carbon atoms; an alkenyl group having 2 to 10 carbon atoms; and an aryl group having 6 to 10 carbon atoms, preferably 6 to 8 carbon atoms. The substituent $R^4$ bonded to the $R^4SiO_{3/2}$ unit (T unit) in the component (A1) preferably has at least one phenyl group. At least one substituent $R^4$ bonded to the $(R^4)_3SiO_{1/2}$ unit (M unit) is preferably an alkenyl group having 2 to 10 carbon atoms.

Specific examples of the $R^4$ in the M unit, D unit, and T unit include lower alkyl groups, such as a methyl group, an ethyl group, a propyl group, and a butyl group; cycloalkyl groups, such as a cyclohexyl group; aryl groups, such as a phenyl group, a tolyl group, and a xylyl group; aralkyl groups, such as a benzyl group, a phenylethyl group, and a phenylpropyl group; alkenyl groups, such as a vinyl group, an allyl group, a propenyl group, an isopropenyl group, a butenyl group, a hexenyl group, a cyclohexenyl group, and an octenyl group; and groups obtained from these groups by substituting a part or all of hydrogen atoms therein with a cyano group, a halogen atom, such as fluorine, bromine, and chlorine, or the like. Examples of such substituted groups include a chloromethyl group, a cyanoethyl group, a 3,3,3-trifluoropropyl group, etc. Among these, a methyl group, a phenyl group, or a vinyl group is preferable.

Examples of the material for obtaining the $SiO_{4/2}$ unit (Q unit) include, but are not limited to, sodium silicate, tetraalkoxysilane, condensation reaction products thereof, etc.

Examples of the material for obtaining the $R^4SiO_{3/2}$ unit (T unit) include, but are not limited to, organosilicon compounds, such as organotrichlorosilane and organotrialkoxysilane, as shown by the following structural formulae, condensation reaction products thereof, etc.

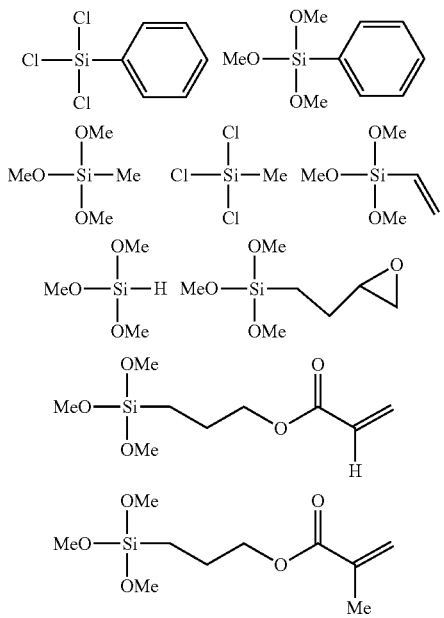

In the formulae, Me represents a methyl group.

Examples of the material for obtaining the $(R^4)_2SiO_{2/2}$ unit (D unit) include, but are not limited to, organosilicon compounds, such as diorganodichlorosilane and diorganodialkoxysilane, as shown by the following structural formulae, etc.

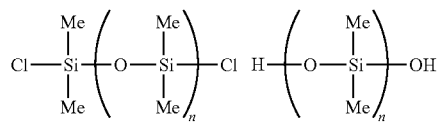

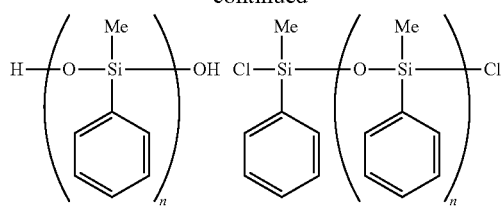

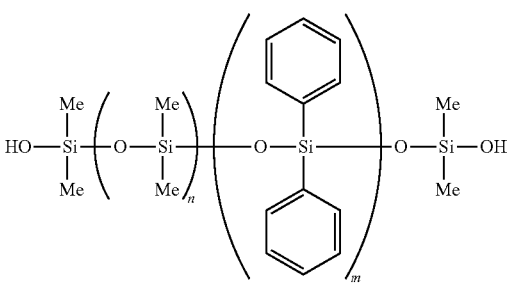

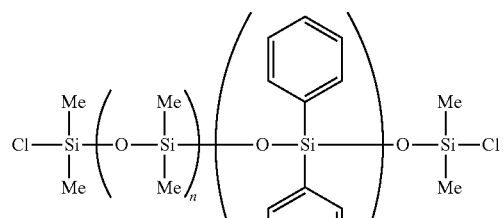

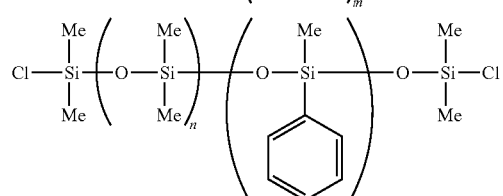

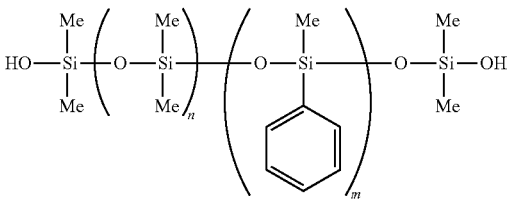

In the formulae, Me represents a methyl group. "n" represents an integer of 5 to 80, and "m" represents an integer of 5 to 80, given that n+m≤78.

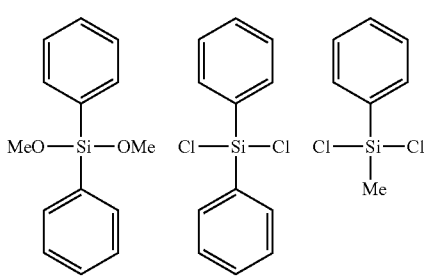

-continued

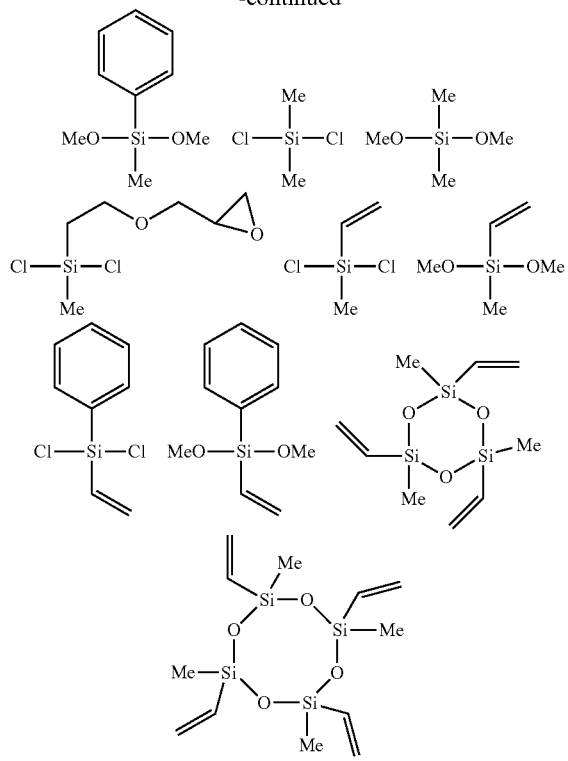

In the formulae, Me represents a methyl group.

Examples of the material for obtaining the $(R^4)_3SiO_{1/2}$ unit (M unit) include, but are not limited to, organosilicon compounds, such as triorganochlorosilane, triorganoalkoxysilane, and hexaorganodisiloxane, as shown by the following structural formulae, etc.

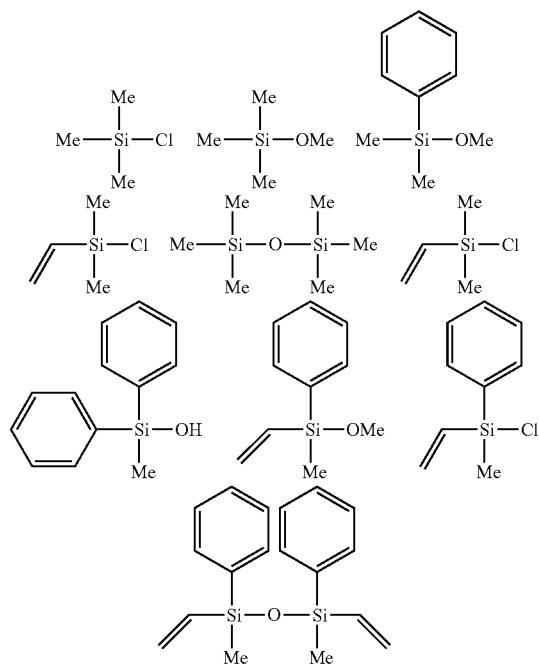

In the formulae, Me represents a methyl group.

[(A2) Linear or Branched Organopolysiloxane]

The component (A2) is a linear or branched organopolysiloxane having two or more alkenyl groups bonded to silicon atoms per molecule, the alkenyl groups each having 2 to 10 carbon atoms. The linear or branched organopolysiloxane has a viscosity at 25° C. of 10 to 100,000 mPa·s as measured by a method described in JIS K 7117-1:1999.

By adding the component (A2) to the inventive curable organosilicon resin composition, viscosity and hardness adjustments are possible in accordance with the usage.

Examples of the alkenyl group having 2 to 10, preferably 2 to 5, carbon atoms include a vinyl group, an allyl group, a propenyl group, an isopropenyl group, a butenyl group, a hexenyl group, a cyclohexenyl group, an octenyl group, etc. A vinyl group is preferable. The number of such alkenyl groups is preferably two or more, more preferably 2 to 5, per molecule.

The viscosity of the organopolysiloxane at 25° C. measured by the method described in JIS K 7117-1:1999 is preferably 10 to 100,000 mPa·s, more preferably 100 to 50,000 mPa·s, further preferably 1,000 to 30,000 mPa·s.

When the viscosity is 10 mPa's or more, the composition will not become brittle. When the viscosity is 100,000 mPa·s or less, the workability will not be lowered.

Specific examples of the organopolysiloxane include, but are not limited to, the following.

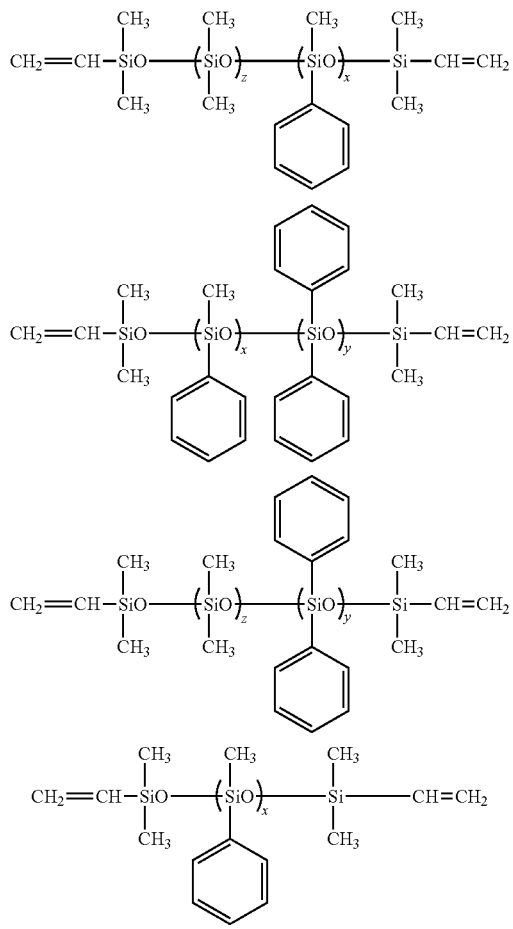

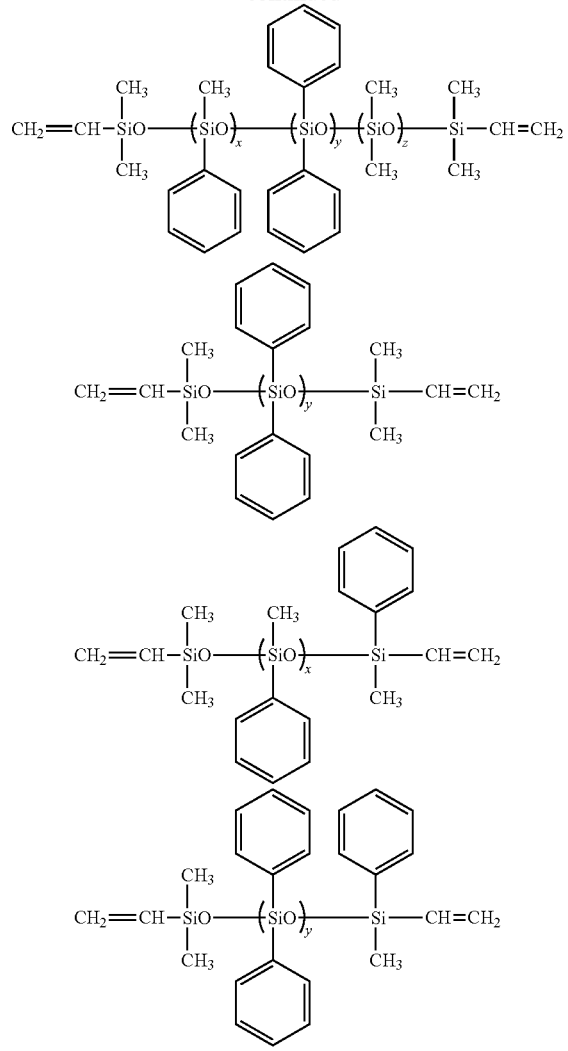
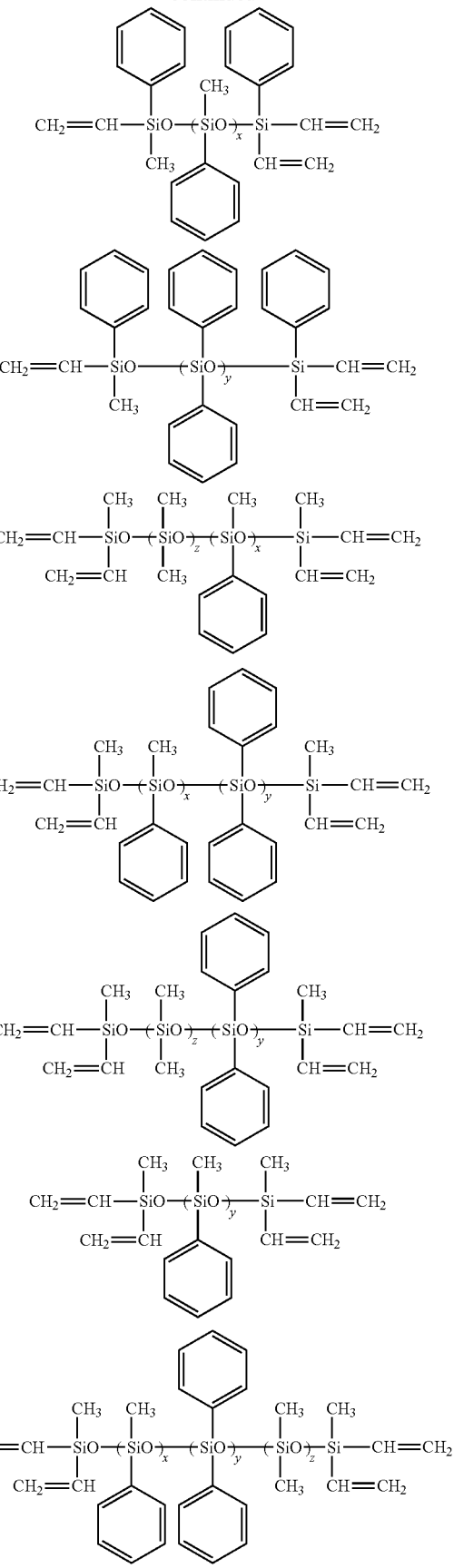
In the formulae, "x", "y", and "z" each represent an integer of 0 or more, and the numbers satisfy $x+y \geq 1$.
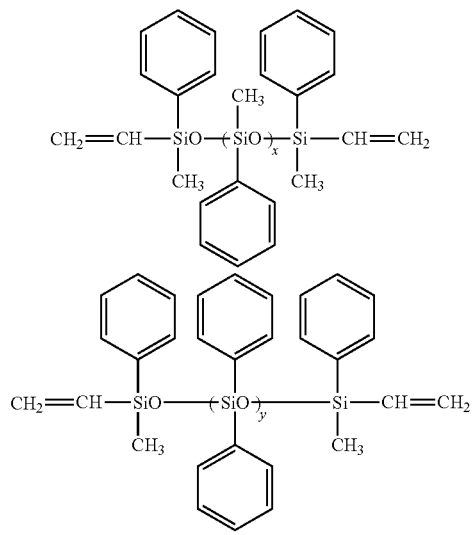

-continued

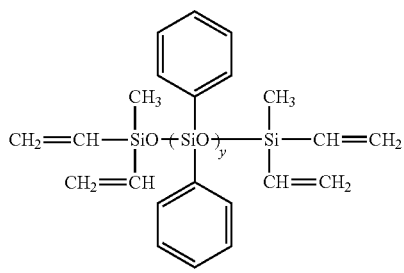

In the formulae, "x", "y", and "z" each represent an integer of 0 or more, and the numbers satisfy x+y≥1.

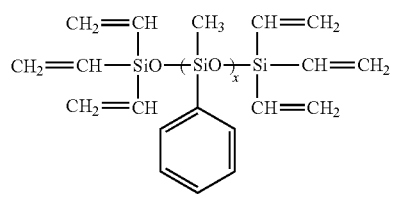

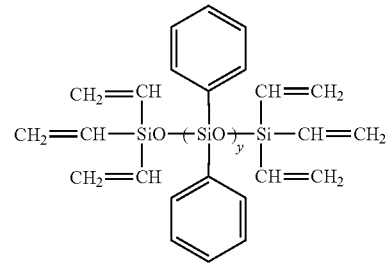

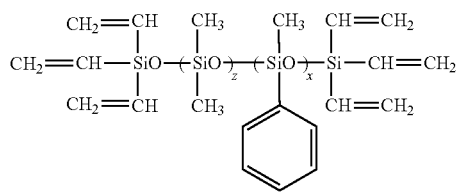

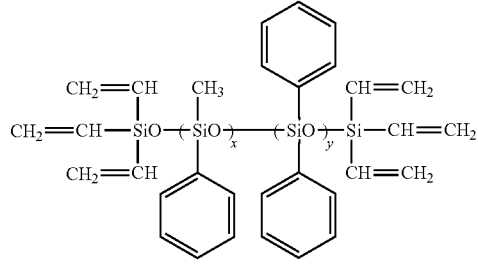

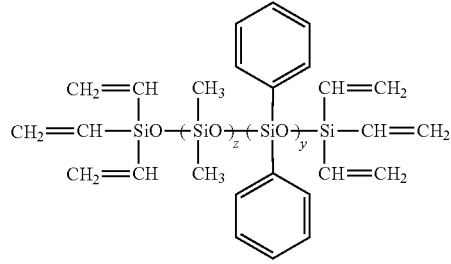

-continued

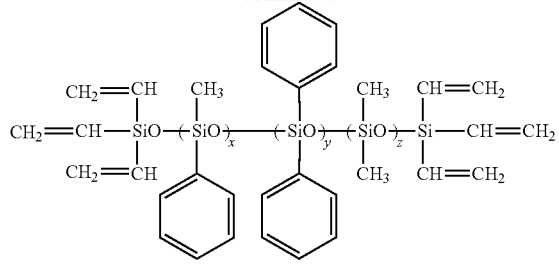

In the formulae, "x", "y", and "z" each represent an integer of 0 or more, and the numbers satisfy x+y≥1.

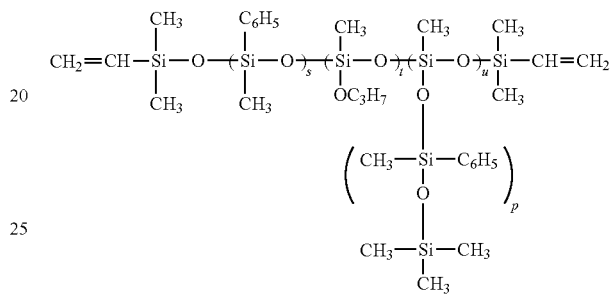

In the formulae, "s", "t", "u", and "p" each represent an integer of 0 or more, and the numbers satisfy s+t+u+p≥1.

When the component (A2) is added, the amount is preferably 0 to 95 mass %, more preferably 5 to 90 mass %, given that a total amount of the components (A1) and (A2) is 100 mass %. In other words, the amount of the component (A1) is preferably 5 to 100 mass %, more preferably 10 to 95 mass %. This makes handleability excellent.

[(B) Hydrosilyl Group-Containing Organosilicon Compound]

The component (B) is an organosilicon compound having at least two, preferably 2 to 5, hydrogen atoms bonded to silicon atoms (hydrosilyl groups) per molecule. The amount of SiH groups in the component (B) is 0.1 to 4.0 mol, preferably 0.5 to 2.0 mol, further preferably 0.7 to 1.5 mol, relative to 1 mol of alkenyl groups contained in the component (A).

The component (B) is an organohydrogenpolysiloxane having at least two or more silicon atom-bonded hydrogen atoms per molecule. Preferably, the component (B) is selected from organohydrogenpolysiloxanes each having one or more silicon-bonded aryl groups. Alternatively, the component (B) can be shown by the following average compositional formula (5).

$$R^6_a H_b SiO_{(4-a-b)/2} \quad (5)$$

In the formula, $R^6$'s may be identical or different and each represent an unsubstituted or substituted monovalent hydrocarbon group having 1 to 10 carbon atoms. "a" and "b" represent positive numbers satisfying preferably 0.7≤a≤2.1, 0.001≤b≤1.0, and 0.8≤a+b≤3.0, more preferably 1.0≤a≤2.0, 0.01≤b≤1.0, and 1.5≤a+b≤2.5.

Specific examples of $R^6$ include: saturated aliphatic hydrocarbon groups, such as a methyl group, an ethyl group, a propyl group, a butyl group, and a pentyl group; saturated cyclic hydrocarbon groups, such as a cyclopentyl group and a cyclohexyl group; aromatic hydrocarbon groups. Examples of the aromatic hydrocarbon groups include aryl groups, such as a phenyl group, a tolyl group, and a xylyl group; aralkyl groups, such as a benzyl group, a phenylethyl group, and a phenylpropyl group; etc. Other examples of $R^6$ include groups obtained from these groups by substituting a part or all of hydrogen atoms bonded to a carbon atom (s) therein with a halogen atom, such as fluorine, bromine, and chlorine. Examples of such substituted groups include halogenated hydrocarbon groups, such as a trifluoropropyl group and a chloropropyl group; etc. Among these, preferable are a phenyl group and saturated hydrocarbon groups having 1 to 5 carbon atoms, such as a methyl group, an ethyl group, and a propyl group.

The organohydrogenpolysiloxane as the component (B) contains at least two (normally, 2 to 200), preferably three or more (normally, 3 to 100), silicon atom-bonded hydrogen atoms (hydrosilyl groups). The component (B) reacts with the component (A) and works as a crosslinking agent.

The molecular structure of the component (B) is not particularly limited. Any molecular structure such as, for example, linear, cyclic, branched, or three-dimensional network (resinous) structure, may be adopted in the component (B).

When the component (B) has a linear structure, the hydrosilyl groups may be bonded to silicon atoms at one or both of terminals and side chains of the molecular chain. Moreover, it is possible to use an organohydrogenpolysiloxane in which the number of silicon atoms in one molecule (or polymerization degree) is normally 2 to 200, preferably 3 to 100 or so, and which is liquid or solid at room temperature (25° C.).

Specific examples of the organohydrogenpolysiloxane shown by the average compositional formula (5) include tris(hydrogendimethylsiloxy)phenylsilane, methylhydrogensiloxane-diphenylsiloxane copolymers capped at both terminals with trimethylsiloxy groups, methylhydrogensiloxane-diphenylsiloxane-dimethylsiloxane copolymers capped at both terminals with trimethylsiloxy groups, methylhydrogensiloxane-methylphenylsiloxane-dimethylsiloxane copolymers capped at both terminals with trimethylsiloxy groups, methylhydrogensiloxane-dimethylsiloxane-diphenylsiloxane copolymers capped at both terminals with dimethylhydrogensiloxy groups, methylhydrogensiloxane-dimethylsiloxane-methylphenylsiloxane copolymers capped at both terminals with dimethylhydrogensiloxy groups; copolymers composed of $(CH_3)_2HSiO_{1/2}$ unit, $SiO_{4/2}$ unit, and $(C_6H_5)_3SiO_{1/2}$ unit; etc.

It is also possible to use organohydrogenpolysiloxanes shown by the following structures without limitation thereto.

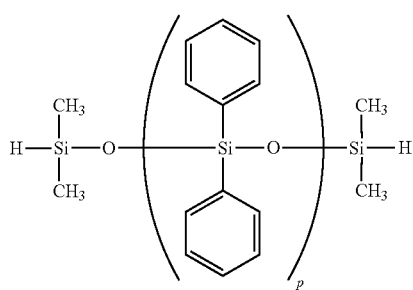

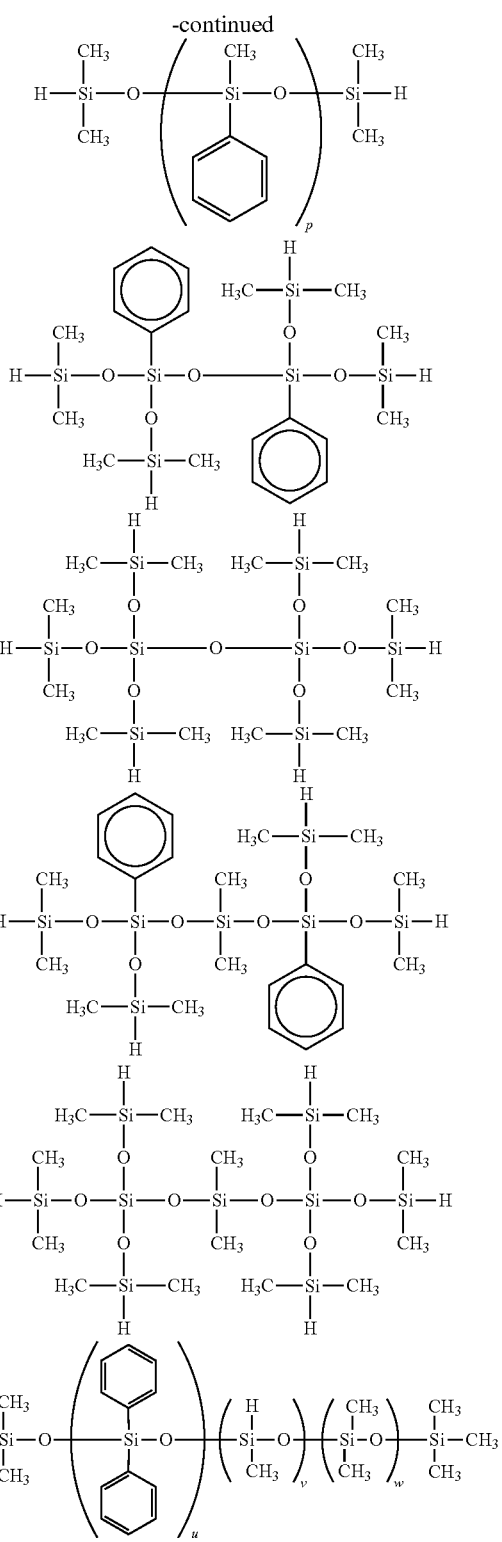

In the formulae, "p" represents an integer of 0 or more, "u", "v", and "w" represent positive integers with v≥2.

The amount of the component (B) added is such that the amount of hydrosilyl groups in the component (B) is 0.1 to 4.0 mol, preferably 0.5 to 3.0 mol, more preferably 0.8 to 2.0 mol, per mol of silicon atom-bonded alkenyl groups in the organosilicon resin composition.

If the component (B) is added such that the amount of hydrosilyl groups in the component (B) is smaller than 0.1 mol, the curing reaction of the inventive composition does not proceed, making it difficult to obtain a cured silicone product. Otherwise, the resulting cured product has too low crosslinking density, the mechanical strength is not enough, and the heat resistance is adversely influenced. Meanwhile, if the component (B) is added such that the amount of hydrosilyl groups is larger than 4.0 mol, many hydrosilyl groups remain unreacted in the resulting cured product, so that the physical properties change over time and the heat resistance of the cured product is lowered, for example. Further, foaming due to dehydrogenation reaction may occur in the cured product.

[(C) Platinum Group Metal-Based Catalyst]

The component (C) of the present invention is a platinum group metal-based catalyst. This is blended to cause addition curing reaction of the inventive composition. There are platinum-based, palladium-based, and rhodium-based catalysts. As the platinum group metal-based catalyst, any catalysts conventionally known to promote hydrosilylation reaction can be used. In consideration of cost and so forth, examples of the platinum-based catalysts include platinum, platinum black, chloroplatinic acid, etc.; specifically, $H_2PtCl_6 \cdot p'H_2O$, $K_2PtCl_6$, $KHPtCl_6 \cdot p'H_2O$, $K_2PtCl_4$, $K_2PtCl_4 \cdot P'H_2O$, $PtO_2 \cdot p'H_2O$, $PtCl_4 \cdot p'H_2O$, $PtCl_2$, $H_2PtCl_4 \cdot p'H_2O$ (where p' represents a positive integer), etc.; complexes thereof with hydrocarbons, such as olefins, alcohols, or vinyl group-containing organopolysiloxanes; etc. One of these catalysts can be used alone, or two or more thereof can be used in combination.

The component (C) may be blended in an effective amount for curing. The amount is normally in a range of 0.1 to 500 ppm, particularly preferably 0.5 to 100 ppm, based on the mass of the platinum group metal relative to a total amount of the components (A) and (B).

[(D) Metal Corrosion Inhibitor]

The component (D) of the present invention is a metal corrosion inhibitor that is a silylated isocyanurate compound shown by the general formula (1) described above.

[Production Method for Silylation-Modified Isocyanurate Compound]

The inventive silylation-modified isocyanurate compound can be produced, for example, by hydrolysis reaction of triglycidyl isocyanurate with chlorosilane and alkoxysilane. The conditions for the hydrolysis reaction can be adjusted as appropriate. For example, the reaction ratio between the epoxy groups and trimethylchlorosilane in terms of mol is 1:1.

The silylated isocyanurate compound is capable of exhibiting excellent effects as a metal corrosion inhibitor. When used as a corrosion inhibitor, the silylated isocyanurate compound is may be added in an amount of 0.001 to 5 mass %, preferably 0.01 to 3 mass %, of a resin composition.

To the inventive curable organosilicon resin composition, the following components (E) and (F) can be added in addition to the components (A) to (D).

[(E) Cyclic (Poly) Siloxane]

The component (E) is a cyclic polysiloxane shown by the following general formula (4). When added to the inventive composition, this cyclic polysiloxane imparts adjustment effects for viscosity, curability, and curing properties.

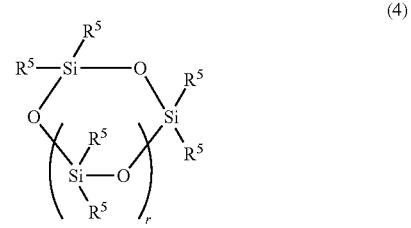

(4)

In the general formula (4), $R^5$'s each independently represent a hydrogen atom, an alkenyl group having 2 to 10 carbon atoms, an alkyl group having 1 to 10 carbon atoms, or an aryl group having 6 to 10 carbon atoms. "r" represents an integer of 1 or 2.

As $R^5$, examples of the alkyl group having 1 to 10 carbon atoms, preferably 1 to 5 carbon atoms, include a methyl group, an ethyl group, a propyl group, a butyl group, a pentyl group, etc. Examples of the alkenyl group having 2 to 10 carbon atoms, preferably 2 to 10 carbon atoms include a vinyl group, an allyl group, a propenyl group, an isopropenyl group, a butenyl group, a hexenyl group, a cyclohexenyl group, an octenyl group, etc. Examples of the aromatic hydrocarbon group having 6 to 10 carbon atoms, preferably 6 to 8 carbon atoms, include aryl groups, such as a phenyl group, a tolyl group, and a xylyl group; aralkyl groups, such as a benzyl group, a phenylethyl group, and a phenylpropyl group; etc. Among these, $R^5$ is preferably a hydrogen atom, a vinyl group, a methyl group, and a phenyl group, but a hydrogen atom and a vinyl group do not co-exist in one molecule.

The cyclic polysiloxane is added in an amount of preferably 0.1 to 30 mass %, more preferably 0.2 to 20 mass %, relative to a total mass of the components (A) and (B). Further, in the case where the component (E) has an alkenyl group and/or a hydrogen atom directly bonded to a silicon atom, it is preferable to simultaneously satisfy that a total amount of hydrosilyl groups in the inventive composition is 0.1 to 4.0 mol, preferably 0.5 to 2.0 mol, per mol of a total amount of alkenyl groups in the composition.

As specific examples of the cyclic organopolysiloxane shown by the general formula (4), cyclic polysiloxanes shown by the following structures can be used, but are not limited thereto.

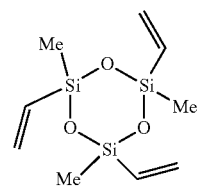

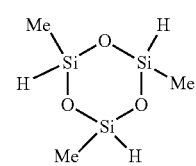

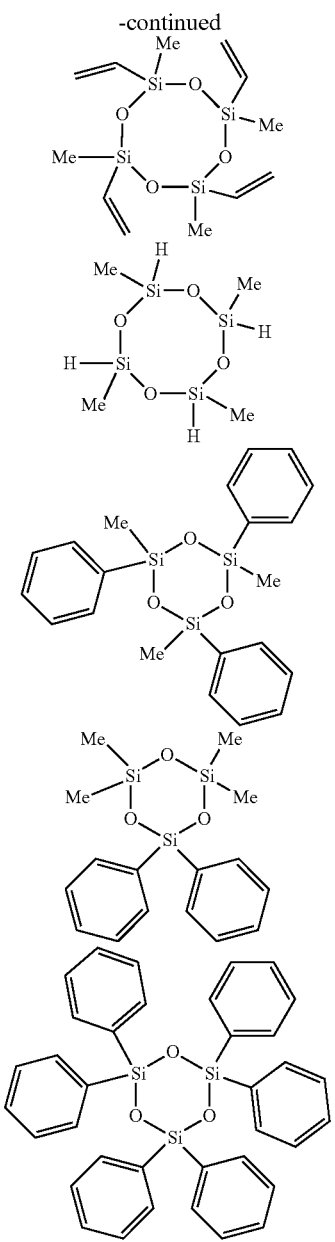

In the formulae, Me represents a methyl group.

[(F) Fluorescent Substance, White Pigment]

Additionally, the inventive curable organosilicon resin composition may be further blended with (F) a fluorescent substance or white pigment. Because of excellent weather resistance, even when the inventive curable organosilicon resin composition contains a fluorescent substance, there is no risk of having significantly lowered fluorescent property, unlike conventional arts.

The fluorescent substance or white pigment is added in an amount of preferably 0 to 500 parts by mass, more preferably 0 to 300 parts by mass, relative to 100 parts by mass of the total of the components (A) and (B).

In this case, the inventive composition preferably contains, as the white pigment, at least one inorganic white pigment selected from the group consisting of titanium oxide, zinc oxide, zirconium oxide, calcium carbonate, magnesium oxide, aluminum hydroxide, barium carbonate, magnesium silicate, zinc sulfate, and barium sulfate. These can be appropriately blended in an amount of 600 parts by mass or less (e.g., 0 to 600 parts by mass, normally 1 to 600 parts by mass, preferably 10 to 400 parts by mass) per 100 parts by mass of a total of the components (A) to (D).

[(G) Others]

Examples of other additives include reinforcing inorganic fillers of silica, glass fiber, fumed silica, etc.; non-reinforcing inorganic fillers of calcium carbonate, calcium silicate, titanium dioxide, ferric oxide, carbon black, cerium fatty acid salt, barium fatty acid salt, cerium alkoxide, barium alkoxide, etc.; and nano-fillers of silicon dioxide (silica: $SiO_2$), aluminum oxide (alumina: $Al_2O_3$), iron oxide ($FeO_2$), triton tetraoxide ($Fe_3O_4$), lead oxide ($PbO_2$), tin oxide ($SnO_2$), cerium oxide ($Ce_2O_3$ or $CeO_2$), calcium oxide (Cao), trimanganese tetraoxide ($Mn_3O_4$), barium oxide (Bao), etc. These can be appropriately blended in an amount of 600 parts by mass or less (e.g., 0 to 600 parts by mass, normally 1 to 600 parts by mass, preferably 10 to 400 parts by mass) per 100 parts by mass of the total of the components (A) to (D).

The inventive curable organosilicon resin composition can be applied to a certain substrate according to the use and then cured. As a curing condition, the inventive composition is sufficiently cured at normal temperature (25° C.), but may be cured by heating as necessary. The heating temperature can be, for example, 60 to 200° C.

Moreover, the inventive curable organosilicon resin composition is preferably cured by heating with a thickness of 1 mm; in other words, resulting in a cured product which has a thickness of 1 mm and which has a light transmittance of 70% or more, preferably 80% or more, at a wavelength of 400 to 800 nm, particularly 450 nm, as measured according to JIS K 7361-1. Note that, in the light transmittance measurement, for example, a spectrophotometer U-4100 manufactured by Hitachi Group. can be used.

In addition, when cured by heating, the inventive curable organosilicon resin composition preferably results in a cured product which has a refractive index within a range of 1.43 to 1.57 at 589 nm and 23° C. as measured according to a method in JIS K 7142: 2014 A.

A cured product having such direct light transmittance and refractive index is excellent in transparency and particularly suitably usable for optical uses such as an encapsulant for LED.

The inventive curable organosilicon resin composition as described above results in a cured product excellent in mechanical properties, transparency, crack resistance, heat resistance, and sulfurization resistance.

<Semiconductor Apparatus>

Furthermore, the present invention provides a semiconductor apparatus including a semiconductor device encapsulated by the above-described cured product of the inventive curable organosilicon resin composition.

As has been described above, the inventive curable organosilicon resin composition forms a cured product excellent in transparency and heat resistance. Thus, the cured product is suitable for a lens material, a protective coating agent, a molding agent, and so forth for light-emitting semiconductor devices, and particularly useful for encapsulating LED devices such as blue LED, white LED, and ultraviolet LED. Moreover, since the inventive curable organosilicon resin composition is excellent in heat resistance, even when the inventive curable organosilicon resin composition mixed with a silicate-based fluorescent substance or a quantum dot fluorescent substance is used as a material for a wavelength conversion film, a light-emitting semiconductor device can be provided which can ensure long-time reliability under high humidity and has favorable moisture resistance and long-time color rendering property. From the foregoing, the semiconductor device is preferably a light-emitting device.

In encapsulating a light-emitting semiconductor device such as LED with the inventive curable organosilicon resin composition, for example, it is possible to encapsulate an LED device with a cured product of the inventive curable organosilicon resin composition by: applying the curable organosilicon resin composition onto an LED device mounted on a pre-mold package made of thermoplastic resin; and then curing the composition on the LED device. The composition can also be applied onto an LED device in a form of varnish prepared by dissolving the composition in an organic solvent such as toluene, xylene, or PGMEA.

The inventive curable organosilicon resin composition has excellent properties such as heat resistance, sulfurization resistance, ultraviolet resistance, transparency, crack resistance, and long-time reliability. Accordingly, the inventive curable organosilicon resin composition is an optimum material for optical uses, such as display material, optical memory medium material, optical device material, optical component material, optical fiber material, photofunctional-electronfunctional organic material, and peripheral material for semiconductor integrated circuit.

EXAMPLE

Hereinafter, the present invention will be described in more details by showing Examples and Comparative Examples. However, the present invention is not limited to the following Examples. Note that part (s) mean part (s) by mass, Me represents a methyl group, Vi represents a vinyl group, and Ph represents a phenyl group.

Additionally, in Examples, the 1H-NMR measurement was performed with an apparatus (apparatus name: AVAN-CEIII 400M) manufactured by BRUKER Corporation by using deuterated chloroform as a solvent and chloroform as an internal standard.

Example 1

Synthesis Example

Into a reaction container, 297.3 g (1.0 mol) of triglycidyl isocyanurate was added and dissolved in 350 g of toluene. To this, 217.3 g (2.0 mol) of trimethylchlorosilane was added, and the temperature was increased to 80° C. To the resultant, 18 g (1.0 mol) of water was added dropwise over 30 minutes. After completion of the dropwise addition, the mixture was further heated at 80° C. for 3 hours with stirring. Note that tris(pentafluorophenyl) borane was added as a reaction catalyst for the chemical reaction.

After completion of the heating, the resultant was cooled to room temperature (25° C.), and washed with aqueous solution of 10 mass % sodium sulfate. Then, to adsorb the tris(pentafluorophenyl) borane for removal, 50 g of magnesium-aluminum based solid solution (product name: KW-2200, manufactured by Kyowa Chemical Industry Co., Ltd.) was added and stirred for 1 hour at 25° C. This KW-2200 was removed by pressure filtration, and the remaining solvent was distilled off under reduced pressure. Thus, a mixture of silylated isocyanurate compounds shown by the following formulae (A') and (B') was obtained.

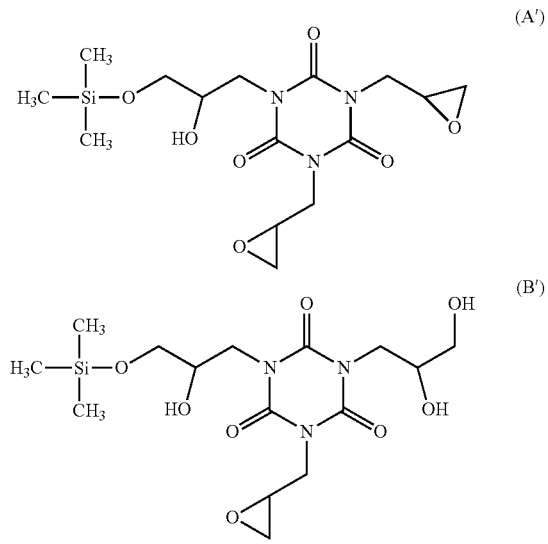

FIG. 1 shows a $^1$H-NMR chart of this mixture. Note that peaks in the chart are as follows.

$^1$H-NMR (CDCl$_3$) ppm: δ 0.00 (9H), δ 2.5-2.7 (2.7H), δ 3.1 (1.3H), δ 3.5 (1.7H), δ 3.6-3.8 (1.8H), θ 3.8-4.1 (6H), δ 3.8-4.1 (6H), δ 4.1-4.3 (0.9H).

[Preparation of Silicone Resin Composition]

A uniformly-mixed mixture was obtained from: 157 parts by mass of a linear dimethylpolysiloxane (viscosity: 5,000 mPa·s, vinyl group equivalent: 0.006 mol/100 g) in which both terminals of the molecular chain were capped with vinyl groups; 50 parts by mass of a resinous (network-structured) organopolysiloxane (weight-average molecular weight: 5,200, vinyl group equivalent: 0.095 mol/100 g) composed of 6.9 mol % of CH$_2$=CH(CH$_3$)$_2$SiO$_{1/2}$ unit, 37.3 mol % of (CH$_3$)$_3$SiO$_{1/2}$ unit, and 55.8 mol % of SiO$_{4/2}$ unit; and 8.1 parts by mass of an organohydrogenpolysiloxane having an average structural formula shown by the following formula (C').

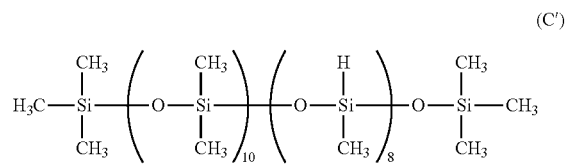

To this mixture, 2.2 parts by mass of the silylated isocyanurate compounds synthesized in Synthesis Example was added as a corrosion inhibitor and mixed. Then, 0.2 parts by mass of 1,3-divinyltetramethyldisiloxane platinum (0) complex (platinum content: 1.0 mass %) was added and mixed. Thus, a silicone resin composition was prepared.

[Heat Resistance]

The prepared silicone resin composition was heated at 150° C. for 4 hours and molded to obtain a cured product (10 mm×15 mm×1 mmt). Such cured products were subjected to a heat resistance test under 200° C. condition for 100 hours. The appearance of each cured product and the value of light transmittance at 450 nm after the heat resistance test were compared with the initial appearance and light transmittance (before the test) to evaluate the heat resistance. Note that the initial appearance of the cured product samples was colorless and transparent. Further, the appearance of the samples after the heat resistance test was also colorless and transparent.

In the heat resistance test, unsaturated Highly Accelerated Stress Test equipment (apparatus name: HASTEST PC-242HSR2) manufactured by HIRAYAMA Manufacturing Corporation was used. Additionally, the light transmittance was measured using a spectrophotometer (apparatus name: U-4100) manufactured by Hitachi High-Tech Corporation. Table 1 shows the results.

[Sulfurization Resistance]

A 1-cm$^2$ silver-plated plate was encapsulated by the prepared organosilicon resin composition to a thickness of 0.6 mm, followed by curing at 150° C. for 4 hours. The resulting sample and 3 g of a sulfur powder were charged into a hermetically-sealed container and allowed to stand in a thermostat at 80° C. for 50 hours. Then, the initial light reflectance of the silver-plated plate at 450 nm was measured using X-rite 8200 manufactured by SDG Co., Ltd. The initial reflectance was 90%.

The sulfurization resistance was calculated by the following formula, and assessed according to the following criteria.

Sulfurization resistance (%)=((reflectance [%] after sulfurization test)/(initial reflectance [%]))×100
(Assessment criteria)

A: sulfurization resistance of 90% or more
B: sulfurization resistance of 85% or more and less than 90%
C: sulfurization resistance of less than 85%

Comparative Example 1

A silicone resin composition was prepared as in Example 1, except that the inventive silylated isocyanurate compound was not added. Moreover, as in Example 1, the heat resistance and the sulfurization resistance were evaluated. The initial appearance of the cured product samples was colorless and transparent, and the appearance of the samples after the heat resistance test was also colorless and transparent. Meanwhile, the reflectance became 76.1% (after the sulfurization resistance test) from 90% (initial value). Table 1 also shows these results.

Comparative Example 2

A silicone resin composition was prepared as in Example 1, except that 2.2 parts by mass of benzotriazole was added in place of the inventive silylated isocyanurate compound. Moreover, as in Example 1, the heat resistance and the sulfurization resistance were evaluated. The initial appearance of the cured product samples was colorless and transparent, but the appearance of the samples after the heat resistance test was reddish brown and transparent. The transmittance became 86.9%. Further, the reflectance became 87.8% (after the sulfurization resistance test) from 90% (initial value). Table 1 also shows these results.

Comparative Example 3

A silicone resin composition was prepared as in Example 1, except that 2.2 parts by mass of zinc 2-ethylhexanoate was added in place of the inventive silylated isocyanurate compound. Moreover, as in Example 1, the heat resistance and the sulfurization resistance were evaluated. The initial appearance of the cured product samples was colorless and transparent, but the appearance of the samples after the heat resistance test was yellow and transparent. The transmittance became 90.3%. Further, the reflectance became 85.9% (after the sulfurization resistance test) from 90% (initial value). Table 1 also shows these results.

TABLE 1

| | | Example 1 | Comparative Example 1 | Comparative Example 2 | Comparative Example 3 |
|---|---|---|---|---|---|
| Heat resistance | Appearance of cured product | Colorless, transparent | colorless, transparent | reddish brown, transparent | yellow, transparent |
| | Transmittance (450 nm, 1 mmt) | 99.6 | 99.7 | 86.9 | 90.3 |
| Sulfurization resistance | Reflectance (450 nm) | A (93.8%) | C (76.1%) | B (87.8%) | B (85.9%) |
| Corrosion inhibitor | | the present invention | none | benzotriazole | zinc 2-ethylhexanoate |

As shown in Table 1, in Comparative Example 1 in which no corrosion inhibitor was incorporated, the appearance after the heat resistance test was colorless and transparent, and the heat resistance was exhibited. However, the sulfurization resistance was greatly lowered. Meanwhile, in Comparative Examples 2 and 3 whose corrosion inhibitors were benzotriazole and zinc 2-ethylhexanoate, the discoloration was observed after the heat resistance test. Thus, the discoloration resistance was poor, and the heat resistance was lowered. Further, the sulfurization resistance was also lowered.

In contrast, the cured product (Example 1) obtained from the addition reaction-curable composition containing the inventive silylated isocyanurate compound as the corrosion inhibitor had high transmittance after the heat resistance test and high reflectance after the sulfurization resistance test. These revealed that the inventive silylated isocyanurate compound is particularly preferable as a metal corrosion inhibitor and a corrosion inhibitor of a resin composition used for a semiconductor protection layer.

As Examples 2 to 4 and Comparative Examples 4 to 7, compositions described in detail below were prepared. The physical properties of the prepared compositions and cured products thereof were measured by the following methods. Table 3 shows the results.

[Property Evaluations]
(1) State

Before curing, the fluidity of each composition was checked. The composition was added in an amount of 50 g into a 100-ml glass vial, and the glass vial was horizontally placed and left alone at 25° C. for 10 minutes. The composition was determined to be liquid when the resin started to flow out in this period.

(2) Viscosity

The viscosity at 25° C. of each composition before curing was measured by the method described in JIS K 7117-1: 1999.

(3) Refractive Index

As the refractive index of each composition before curing, the refractive index with respect to light with a wavelength of 589 nm was measured at 25° C. using a digital refractomer RX-9000α manufactured by ATAGO CO., LTD.

(4) Hardness (Type D)

The hardness of a cured product obtained by curing each composition at 150° C. for 4 hours was measured with a durometer type D hardness tester based on JIS K 6249:2003.

(5) Elongation at Break and Tensile Strength

The elongation at break and tensile strength of a cured product obtained by curing each composition at 150° C. for 4 hours was measured based on JIS K 6249: 2003.

(6) Heat Resistance

Each silicone resin composition was heated at 150° C. for 4 hours and molded to obtain a cured product (10 mm×15 mm×1 mmt). These cured products were subjected to a heat resistance test under 200° C. condition for 100 hours. The appearance of each cured product and the value of light transmittance at 450 nm after the heat resistance test were compared with the initial appearance and light transmittance (before the test) to evaluate the heat resistance.

In the heat resistance test, unsaturated Highly Accelerated Stress Test equipment (apparatus name: HASTEST PC-242HSR2) manufactured by HIRAYAMA Manufacturing Corporation was used.

Meanwhile, the light transmittance was measured using a spectrophotometer (apparatus name: U-4100) manufactured by Hitachi High-Tech Corporation.

(7) Sulfurization Resistance

A 1-cm$^2$ silver-plated plate was encapsulated using one of organosilicon resin compositions prepared in Examples 2 to 4 and Comparative Examples 4 to 7 to a thickness of 0.6 mm, followed by curing at 150° C. for 4 hours. The resulting sample and 3 g of a sulfur powder were charged into a hermetically-sealed container and allowed to stand in a thermostat at 80° C. for 50 hours. Then, the initial light reflectance of the silver-plated plate at 450 nm was measured using X-rite 8200 manufactured by SDG Co., Ltd. All the initial reflectances were 90%. The sulfurization resistance was calculated by the following formula, and assessed according to the following criteria.

Sulfurization resistance (%)=((reflectance [%] after sulfurization test)/(initial reflectance [%]))×100
(Assessment criteria)

A: sulfurization resistance of 90% or more,
B: sulfurization resistance of 85% or more and less than 90%,
C: sulfurization resistance of less than 85%.

Example 2

A curable organosilicon resin composition was prepared by well stirring a mixture of the following components:

component (A1) that was branched phenylmethylpolysiloxane composed of 75 mol % of $PhSiO_{3/2}$ unit and 25 mol % of $ViPhMeSiO_{1/2}$ unit (Mw=2, 500, the amount of hydroxyl groups bonded to silicon atoms=0.04 mol/100 g, the amount of alkoxy groups bonded to silicon atoms=0.06 mol/100 g) and in an amount of 30 parts;

component (B) that was organohydrogenpolysiloxane shown by the following formula (6) and contained in such an amount that the ratio of the total number of silicon atom-bonded hydrogen atoms in the component (B) to the total number of silicon atom-bonded vinyl groups in the components (A) and (D) (hereinafter also referred to as SiH/SiVi ratio) was 1.0;

component (C) that was an octyl alcohol-modified solution of chloroplatinic acid (platinum element content: 1 mass %) in an amount of 0.01 parts; and component (D) that was shown by the following formula (7) and contained in an amount of 0.05 parts. These are shown in Table 2.

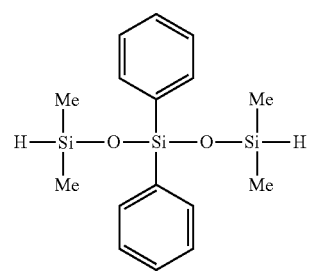

(6)

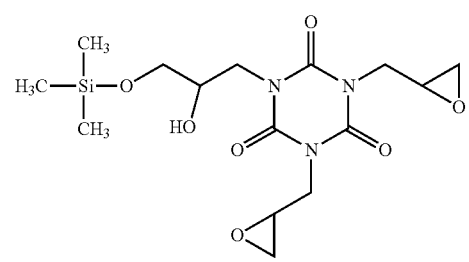

(7)

Example 3

A silicone rubber composition was prepared by well stirring a mixture of the following components:

component (A1) that was the organopolysiloxane used in Example 2 in an amount of 30 parts;

component (B) that was organohydrogenpolysiloxane shown by the formula (6) and contained in such an amount that the ratio of the total number of silicon atom-bonded hydrogen atoms in the component (B) to the total number of silicon atom-bonded vinyl groups in the components (A) and (D) (hereinafter also referred to as SiH/SiVi ratio) was 1.0;

component (C) that was an octyl alcohol-modified solution of chloroplatinic acid (platinum element content: 1 mass %) in an amount of 0.01 parts;

component (D) that was shown by the following formula (8) and contained in an amount of 0.01 parts; and component (E) that was an organosilicon compound shown by the following formula (9) and contained in an amount of 2 parts. These are also shown in Table 2.

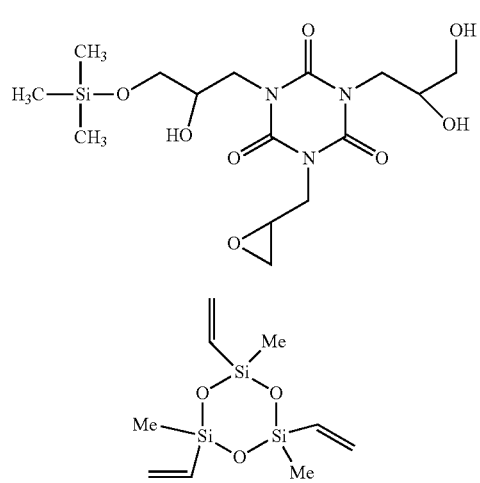

(8)

(9)

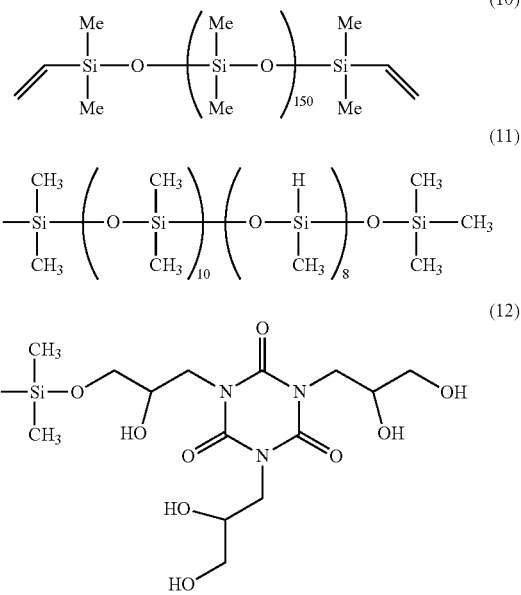

(10)

(11)

(12)

Example 4

A silicone rubber composition was prepared by well stirring a mixture of the following components:

component (A1) that was branched methylpolysiloxane composed of 55 mol % of $SiO_{4/2}$ unit, 7 mol % of $ViMeSiO_{2/2}$ unit, and 38 mol % of $Me_3SiO_{1/2}$ unit (Mw=5,600, the amount of hydroxyl groups bonded to silicon atoms=0.2 mol/100 g, the amount of alkoxy groups bonded to silicon atoms=0.02 mol/100 g) and in an amount of 30 parts;

component (A2) that was shown by the following formula (10) and contained in an amount of 50 parts;

component (B) that was organohydrogenpolysiloxane shown by the following formula (11) and contained in such an amount that the ratio of the total number of silicon atom-bonded hydrogen atoms in the component (B) to the total number of silicon atom-bonded vinyl groups in the components (A) and (D) (hereinafter also referred to as SiH/SiVi ratio) was 1.0;

component (C) that was an octyl alcohol-modified solution of chloroplatinic acid (platinum element content: 1 mass %) in an amount of 0.01 parts;

component (D) that was shown by the following formula (12) and in an amount of 0.01 parts; and component (E) that was an organosilicon compound shown by the formula (9) and in an amount of 1 part. These are also shown in Table 2.

Comparative Example 4

A composition was prepared as in Example 2, except that the component (D) used in Example 2 was not added. Table 2 also shows the results.

Comparative Example 5

A composition was prepared as in Example 2, except that 0.05 parts of triallyl isocyanurate (manufactured by Mitsubishi Chemical Corporation) was used in place of the component (D) used in Example 2. Table 2 also shows the results.

Comparative Example 6

A composition was prepared as in Example 2, except that 0.05 parts of triglycidyl isocyanurate (manufactured by Nissan Chemical Corporation) was used in place of the component (D) used in Example 2. Table 2 also shows the results.

Comparative Example 7

A composition was prepared as in Example 2, except that 0.05 parts of monoallyl diglycidyl isocyanurate (manufactured by Shikoku Chemicals Corporation) was used in place of the component (D) used in Example 2. Table 2 also shows the results.

TABLE 2

|  |  |  | Example 2 | Example 3 | Example 4 | Comparative Example 4 | Comparative Example 5 | Comparative Example 6 | Comparative Example 7 |
|---|---|---|---|---|---|---|---|---|---|
| Component A | Component A1 | units % | | | $PhSiO_{3/2}$ 75 | $SiO_{4/2}$ 55 | | $PhSiO_{3/2}$ 75 | |
|  |  | units % | | | $ViPhMeSiO_{1/2}$ 25 | $ViMeSiO_{2/2}$ 7 | | $ViPhMeSiO_{1/2}$ 25 | |
|  |  | units % | | | | $Me_3SiO_{1/2}$ 38 | | | |
|  |  | weight-average molecular | | | 2500 | 5600 | | 2500 | |

TABLE 2-continued

|  |  | Example 2 | Example 3 | Example 4 | Comparative Example 4 | Comparative Example 5 | Comparative Example 6 | Comparative Example 7 |
|---|---|---|---|---|---|---|---|---|
|  | weight M |  |  |  |  |  |  |  |
|  | hydroxyl group amount [mol/100 g] | 0.04 |  | 0.2 |  | 0.04 |  |  |
|  | alkoxy group amount [mol/100 g] | 0.06 |  | 0.02 |  | 0.06 |  |  |
| Carponent A2 | parts structure | 30 |  | 30 Formula (10) |  | 30 |  |  |
| Component B | parts Organo-hydrogen-polysiloxane | Formula (6) |  | 50 Formula (11) |  | Formula (6) |  |  |
| Component C | SiH/SiVi platinum group metal-based catalyst | 1.0 octyl alcohol-modified solution of chloroplatinic acid |  |  |  | 1.0 octyl alcohol-modified solution of chloroplatinic acid |  |  |
|  | platinum content [mass %] | 1 |  |  |  | 1 |  |  |
| Component D | parts silylated isocyanurate campound | 0.01 Formula (7) | Formula (8) | Formula (12) | none | 0.01 triallyl isocyanurate | triglycidyl isocyanurate | monoallyl diglycidyl isocyanurate |
| Component E | parts cyclic siloxane parts | 0.05 | 0.01 Formula (9) 2 | 0.01 Formula (9) 1 | 0.05 | 0.05 | 0.05 | 0.05 |

TABLE 3

|  |  | Example 2 | Example 3 | Example 4 | Comparative Example 4 | Comparative Example 5 | Comparative Example 6 | Comparative Example 7 |
|---|---|---|---|---|---|---|---|---|
| State |  | liquid | liquid | liquid | liquid | liquid | liquid | liquid |
| Viscosity (Pa · s) |  | 4.2 | 2.5 | 3.4 | 4.3 | 4.2 | 4.4 | 3.4 |
| Refractive index |  | 1.54 | 1.54 | 1.41 | 1.54 | 1.54 | 1.54 | 1.41 |
| Hardness (type D) 150° C. × 4 h |  | 70 | 70 | 15 | 70 | 70 | 70 | 15 |
| Tensile strength (MPa) |  | 12 | 10 | 5 | 12 | 12 | 12 | 5 |
| Elongation at break (%) |  | 60 | 45 | 100 | 60 | 60 | 60 | 100 |
| Appearance of cured product | initial | colorless transparent | colorless transparent | colorless transparent | colorless transparent | colorless transparent | slightly cloudy | colorless transparent |
|  | after heat resistance test | colorless transparent | colorless transparent | colorless transparent | colorless transparent | pale yellow transparent | pale yellow slightly cloudy | pale yellow transparent |
| Transmittance (450 nm, 1 mmt) | initial | 100 | 100 | 100 | 100 | 100 | 85 | 100 |
|  | after heat resistance test | 96.4 | 95.1 | 99.4 | 96.2 | 85.3 | 72.6 | 89.2 |
| Sulfurization resistance | reflectance (450 nm) | A(96.8%) | A(97.5%) | A(91.5%) | B(87.1%) | B(85.9%) | B(85.6%) | C(75.5%) |

As shown in Table 3, in Comparative Example 4 in which the component (D) was not added, the sulfurization resistance was lowered. Further, in Comparative Examples 5 to 7 in which isocyanurate derivatives containing no silyl group were added as the component (D), the heat resistance was lowered and any improvement in sulfurization resistance was not observed, either.

In contrast, as shown in Table 3, in Examples 2 to 4 in which the inventive silylated isocyanurate compounds were used as the component (D), the cured products thus obtained were transparent, and had sufficient hardness and excellent elongation at break, tensile strength, heat resistance, and HAST resistance.

As has been described above, the inventive curable organosilicon resin compositions are capable of forming cured products which exhibit excellent heat resistance and sulfurization resistance.

INDUSTRIAL APPLICABILITY

The inventive silylated isocyanurate compound exhibits excellent effects as a metal corrosion inhibitor. Particularly, the discoloration resistance after heat resistance test is excellent. The inventive silylated isocyanurate compound is thus particularly useful as a corrosion inhibitor of a resin composition employed in usages that require durability and transparency such as sealants for optical semiconductors.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A curable organosilicon resin composition comprising:
   (A) an organosilicon compound having at least two alkenyl groups per molecule;
   (B) an organosilicon compound having at least two hydrogen atoms bonded to silicon atoms per molecule, wherein an amount of SiH groups in the component (B) is 0.1 to 4.0 mol relative to 1 mol of alkenyl groups in the component (A);
   (C) a platinum group metal-based catalyst; and
   (D) a silylated isocyanurate compound as a metal corrosion inhibitor shown by the following general formula (1), wherein the component (A) comprises
   (A1) a resinous organopolysiloxane comprising
      at least two silicon atom-bonded alkenyl groups per molecule, and
      at least any of an $SiO_{4/2}$ unit and an $R^4SiO_{3/2}$ unit, wherein $R^4$ represents an alkyl group having 1 to 10 carbon atoms, an alkenyl group having 2 to 10 carbon atoms, or an aryl group having 6 to 10 carbon atoms, wherein
   the component (A1) is a resinous organopolysiloxane comprising
      0 to 60 mol % of the $SiO_{4/2}$ unit,
      0 to 90 mol % of the $R^4SiO_{3/2}$ unit,
      0 to 50 mol % of an $(R^4)_2SiO_{2/2}$ unit, and
      10 to 50 mol % of an $(R^4)_3SiO_{1/2}$ unit, given that a sum of the $SiO_{4/2}$ unit and the $R^4SiO_{3/2}$ unit is 50 mol % or more,
   the organopolysiloxane has a weight-average molecular weight of 1,000 to 5,000,
   the organopolysiloxane has at least two silicon atom-bonded alkenyl groups per molecule,
   the organopolysiloxane has a hydroxyl group and an alkoxy group each of which is bonded to a silicon atom and is an uncondensed remainder derived from the $SiO_{4/2}$ unit, the $R^4SiO_{3/2}$ unit, the $(R^4)_2SiO_{2/2}$ unit, and the $(R^4)_3SiO_{4/2}$ unit,
   the hydroxyl group is in an amount of 0.001 to 1.0 mol/100 g, and
   the alkoxy group bonded to a silicon atom has 1 to 10 carbon atoms and is in an amount of not more than 1.0 mol/100 g,

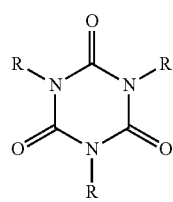

(1)

wherein R's each independently represent a hydrogen atom, or a substituent selected from the group consisting of an alkyl group having 1 to 10 carbon atoms, an alkenyl group having 2 to 10 carbon atoms, and a group shown by the following general formula (2-a) or (2-b), given that at least one of the R's is shown by the following general formula (2-b),

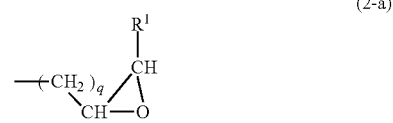

(2-a)

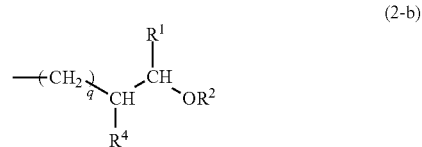

(2-b)

wherein $R^1$ represents a hydrogen atom or an alkyl group having 1 to 8 carbon atoms; "q" represents an integer of 1 to 10; $R^2$'s each independently represent a hydrogen atom, or a substituent selected from the group consisting of an alkyl group having 1 to 10 carbon atoms and a group shown by the following general formula (3), given that at least one of the $R^2$'s is shown by the following general formula (3); and $R^4$ represents a hydrogen atom or $OR^2$,

(3)

wherein $R^3$'s each independently represent a hydrogen atom, or a substituent selected from the group consisting of an alkyl group having 1 to 10 carbon atoms, an alkoxy group having 1 to 10 carbon atoms, an alkenyl group having 2 to 10 carbon atoms, and an aryl group having 6 to 10 carbon atoms.

2. The curable organosilicon resin composition according to claim 1, wherein
   the component (A) further comprises, in addition to the component (A1),
   (A2) a linear or branched organopolysiloxane having two or more silicon atom-bonded alkenyl groups, each having 2 to 10 carbon atoms, per molecule, wherein
   the linear or branched organopolysiloxane has a viscosity at 25° C. of 10 to 100,000 mPa·s as measured by a method described in JIS K 7117-1:1999.

3. The curable organosilicon resin composition according to claim 2, wherein the components (A1) and (A2) are blended in such amounts that the component (A1) is 5 mass % or more and less than 100 mass %, given that a total amount of the components (A1) and (A2) is 100 mass %.

4. The curable organosilicon resin composition according to claim 1, further comprising a component (E) that is a cyclic siloxane shown by the following general formula (4), wherein
   the cyclic siloxane shown by the general formula (4) is in an amount of 0.1 to 30 mass % relative to a total mass of the components (A) and (B), and
   a total amount of hydrosilyl groups in the curable organosilicon resin composition is 0.1 to 4.0 mol per mol of a total amount of alkenyl groups in the curable organosilicon resin composition,

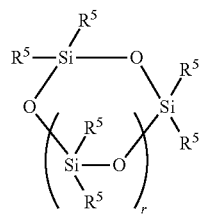

(4)

wherein each $R^5$ independently represents a hydrogen atom, an alkenyl group having 2 to 10 carbon atoms, an alkyl group having 1 to 10 carbon atoms, or an aryl group having 6 to 10 carbon atoms; and "r" represents an integer of 1 or 2.

5. The curable organosilicon resin composition according to claim 1, wherein the curable organosilicon resin composition comprises at least one inorganic white pigment selected from the group consisting of titanium oxide, zinc oxide, zirconium oxide, calcium carbonate, magnesium oxide, aluminum hydroxide, barium carbonate, magnesium silicate, zinc sulfate, and barium sulfate.

6. A semiconductor apparatus comprising:
a cured product of the curable organosilicon resin composition according to claim 1; and
a semiconductor device.

7. The semiconductor apparatus according to claim 6, wherein the cured product with a thickness of 1 mm has a direct light transmittance of 70% or more at a wavelength of 450 nm.

8. The semiconductor apparatus according to claim 6, wherein the semiconductor device is a light-emitting device.

9. The semiconductor apparatus according to claim 7, wherein the semiconductor device is a light-emitting device.

10. A mixture of silylated isocyanurate compounds shown by the following general formulae (A') and (B'):

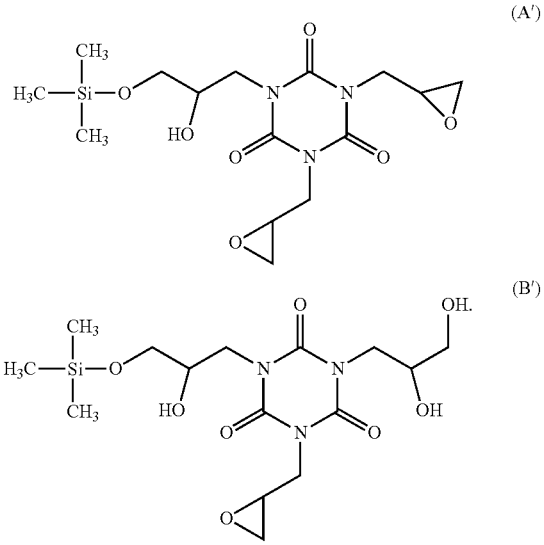

11. A metal corrosion inhibitor comprising the mixture of silylated isocyanurate compounds according to claim 10.

* * * * *